(12) United States Patent
Kwon et al.

(10) Patent No.: US 10,431,320 B2
(45) Date of Patent: Oct. 1, 2019

(54) SEMICONDUCTOR MEMORY DEVICE, METHOD OF TESTING THE SAME AND METHOD OF OPERATING THE SAME

(71) Applicant: SAMSUNG ELECTRONICS CO., LTD., Suwon-si, Gyeonggi-do (KR)

(72) Inventors: Hyung-Shin Kwon, Seongnam-si (KR); Jong-Hyoung Lim, Seoul (KR); Chang-Soo Lee, Suwon-si (KR); Chung-Ki Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 295 days.

(21) Appl. No.: 15/394,973

(22) Filed: Dec. 30, 2016

(65) Prior Publication Data

US 2017/0110203 A1 Apr. 20, 2017

Related U.S. Application Data

(62) Division of application No. 14/188,118, filed on Feb. 24, 2014, now abandoned.

(30) Foreign Application Priority Data

Feb. 25, 2013 (KR) ........................ 10-2013-0019563

(51) Int. Cl.
| | |
|---|---|
| *G11C 29/12* | (2006.01) |
| *G11C 8/08* | (2006.01) |
| *G11C 16/34* | (2006.01) |
| *G11C 29/08* | (2006.01) |
| *G11C 29/10* | (2006.01) |

(Continued)

(52) U.S. Cl.
CPC .......... *G11C 29/12005* (2013.01); *G11C 7/12* (2013.01); *G11C 8/08* (2013.01); *G11C 16/3427* (2013.01); *G11C 29/08* (2013.01); *G11C 29/10* (2013.01); *G11C 29/12* (2013.01); *G11C 29/18* (2013.01); *G11C 2029/1202* (2013.01)

(58) Field of Classification Search
CPC ..... G11C 29/12005; G11C 7/12; G11C 29/18; G11C 29/12; G11C 29/08; G11C 16/3427; G11C 8/08; G11C 29/10; G11C 2029/1202

See application file for complete search history.

(56) References Cited

U.S. PATENT DOCUMENTS

| 5,668,758 A * | 9/1997 | Yiu .................. G11C 5/143 365/185.16 |
|---|---|---|
| 6,807,109 B2 | 10/2004 | Tomishima |

(Continued)

*Primary Examiner* — David Lam
(74) *Attorney, Agent, or Firm* — F. Chau & Associates, LLC

(57) ABSTRACT

A method of testing a semiconductor memory device is provided. Data is written to a plurality of memory cells disposed in a memory cell block of the semiconductor memory device. A first driving voltage is applied to a first group of word lines. A second driving voltage is applied to a second group of word lines. Each word line of the first group of the word lines is interposed between two neighboring word lines of the second group of the word lines. The first driving voltage has a voltage level different from that of the second driving voltage. The data is read from first memory cells coupled to the first group to determine whether each of the first memory cells is defective.

18 Claims, 23 Drawing Sheets

(51) Int. Cl.
*G11C 29/18* (2006.01)
*G11C 7/12* (2006.01)

(56) References Cited

U.S. PATENT DOCUMENTS

| | | | |
|---|---|---|---|
| 8,705,268 B2* | 4/2014 | Buer | G11C 8/08 |
| | | | 365/154 |
| 2008/0043780 A1* | 2/2008 | Kobayashi | G11C 29/24 |
| | | | 370/506 |
| 2012/0201091 A1 | 8/2012 | Hook et al. | |
| 2014/0241076 A1 | 8/2014 | Kwon et al. | |

* cited by examiner

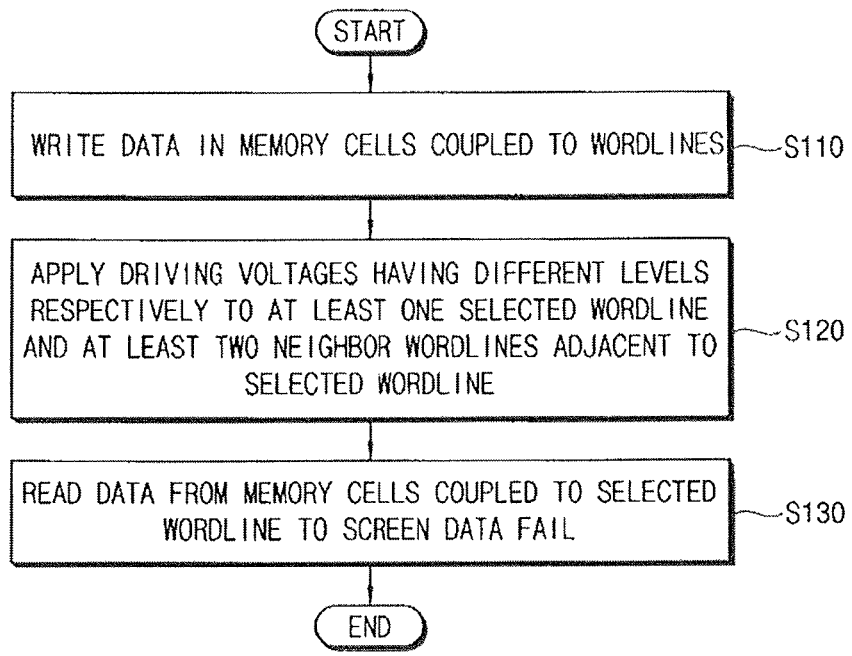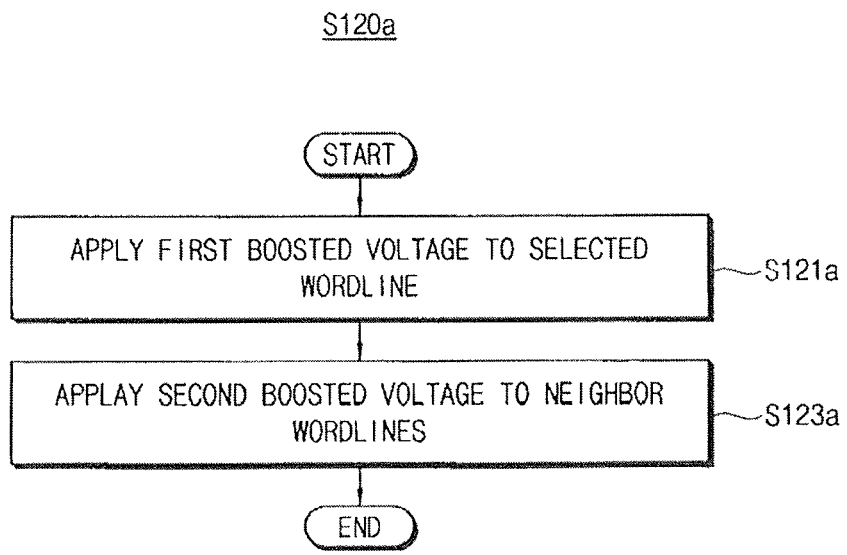

SEMICONDUCTOR MEMORY DEVICE, METHOD OF TESTING THE SAME AND METHOD OF OPERATING THE SAME

CROSS-REFERENCE TO RELATED APPLICATION

This application is a divisional of U.S. application Ser. No. 14/188,118 filed on Feb. 24, 2014, which claims priority under 35 U.S.C. § 119 to Korean Patent Application No. 10-2013-0019563, filed on Feb. 25, 2013 in the Korean Intellectual Property Office (KIPO), the disclosure of which is incorporated by reference herein in its entirety.

TECHNICAL FIELD

The present inventive concept relates to a semiconductor memory device, a method of testing the semiconductor memory device and a method of operating the semiconductor memory device.

DISCUSSION OF THE RELATED ART

Recently, vertical-type cell transistors have been introduced to manufacture high-density semiconductor memory devices. Word lines of memory devices may be driven using a word line driver having vertical-type cell transistors. Coupling noise between neighboring word lines may be increased, resulting in defective memory cells. The number of defective cells may be rapidly increased with the increasing level of integration.

SUMMARY

According to an exemplary embodiment of the inventive concept, a method of testing a semiconductor memory device is provided. Data is written to a plurality of memory cells disposed in a memory cell block of the semiconductor memory device. A first driving voltage is applied to a first group of word lines. A second driving voltage is applied to a second group of word lines. Each word line of the first group of the word lines is interposed between two neighboring word lines of the second group of the word lines. The first driving voltage has a voltage level different from that of the second driving voltage. The data is read from first memory cells coupled to the first group to determine whether each of the first memory cells is defective.

According to an exemplary embodiment of the inventive concept, a method of testing a semiconductor memory device is provided. Data is written to a plurality of memory cells disposed in the semiconductor memory device. The plurality of the memory cells is coupled to a plurality of word lines. A first word line of the plurality of the memory cells is disabled. At least two second word lines are alternately enabled and disabled while the first word line is disabled. The first word line is interposed between the at least two second word lines. Data is read from memory cells coupled to the first word line to screen defective memory cells.

According to an exemplary embodiment of the inventive concept, a method of operating a semiconductor memory device is provided. A plurality of word lines is precharged with a first negative voltage. A first word line of the plurality of the word lines is selected in response to an active command. A second negative voltage is applied to at least one second word line adjacent to the first word line. The first negative voltage has a voltage level different from that of the second negative voltage. Data is written to memory cells coupled to the first word line.

According to an exemplary embodiment of the inventive concept, a semiconductor memory device includes a memory cell, a boosted voltage generator, a negative voltage generator, a plurality of sub word line drivers, and a plurality of switching units. The memory cell block includes a plurality of memory cells coupled to a plurality of word lines. The boosted voltage generator generates a first boosted voltage and a second boosted voltage. The first boosted voltage has a voltage level different from that of the second boosted voltage. The negative voltage generator generates a first negative voltage and a second negative voltage. The first negative voltage has a voltage different from that of the second negative voltage. Each sub word line driver drives each word line. Each switching unit selectively provides one of the first boosted voltage, the second boosted voltage, the first negative voltage and the second negative voltage to a corresponding sub word line driver of the plurality of the sub word line drivers according to an operation mode.

According to an exemplary embodiment of the inventive concept, a mode control unit, a boosted voltage generator, a negative voltage generator, a sub word line driver, and a switching unit. The mode control unit generates a plurality of selection signals in response to a plurality of test signals. The boosted voltage generator generates a first boosted voltage and a second boosted voltage, wherein the first boosted voltage has a voltage level different from that of the second boosted voltage. The negative voltage generator generates a first negative voltage and a second negative voltage. The first negative voltage has a voltage different from that of the second negative voltage. The sub word line driver provides a driving voltage to a word line. The switching unit selectively provides one of the first boosted voltage, the second boosted voltage, the first negative voltage and the second negative voltage to the sub word line driver according to the plurality of the selection signals.

BRIEF DESCRIPTION OF THE DRAWINGS

These and other features of the inventive concept will become more apparent by describing in detail exemplary embodiments thereof with reference to the accompanying drawings of which:

FIG. 1 is a flow chart illustrating a method of testing a semiconductor memory device according to an exemplary embodiment of the present inventive concept;

DETAILED DESCRIPTION OF THE EMBODIMENTS

Figure 2B:
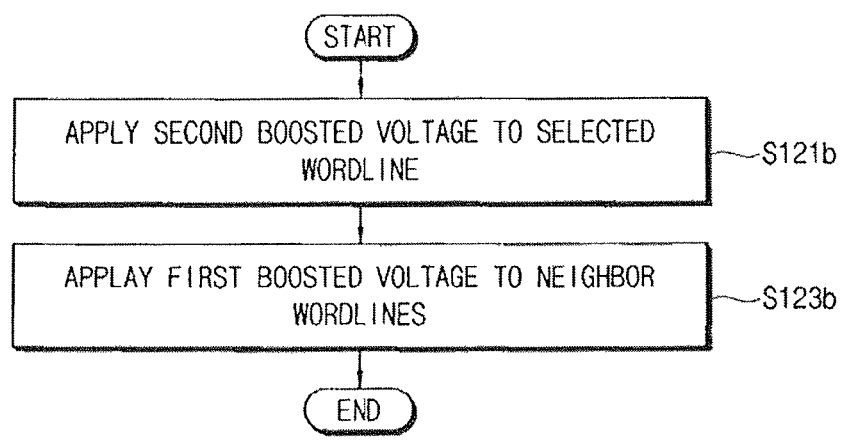
FIGS. 2A through 3B are flow charts illustrating the step S120 in FIG. 1 according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings. It will be understood that when an element is referred to as being "connected" or "coupled" to another element, it can be directly connected or coupled to the other element or intervening elements may be present.

FIG. 1 is a flow chart illustrating a method of testing a semiconductor memory device according to an exemplary embodiment.

Referring to FIG. 1, in a method of testing a semiconductor memory device, data is written in a plurality of memory cells coupled to a plurality of word lines (S110). The plurality of memory cells are included in a memory cell block of the semiconductor memory device.

At least one word line is selected from the plurality of word lines, and driving voltages having different levels are applied to the at least one selected word line and at least two neighboring word lines adjacent to the at least one selected word line (S120). For a first test mode, different boosting voltage levels are applied to the selected word line and the neighboring word lines. For a second test mode, negative (lower than zero) voltages having different levels are applied to the selected word line and the neighboring word lines.

When the driving voltages having different levels are applied to the at least one selected word line and at least two neighboring word lines after data are written in the memory cells, threshold voltage of selected memory cells coupled to the selected word line is influenced by driving voltage applied to the neighboring word lines and the threshold voltage of the selected memory cells may be lowered. When the threshold voltage of the selected memory cells is lowered, charges stored in a cell capacitor coupled to a cell transistor may leak through the cell transistor, data fail may occur in read operation. The leakage occurs due to neighboring gate effect. The neighboring gate effect increases as two adjacent word lines are close to each other, thereby the two adjacent word lines having an increased coupling effect. The neighboring gate effect means that the selected word line voltage fluctuates due to adjacent word lines.

After the driving voltages having different levels are applied, data of the memory cell are read to screen defective memory cells having data fail (130).

FIGS. 2A through 3B are flow charts illustrating the step S120 in FIG. 1 according to an exemplary embodiment.

Referring to FIG. 2A, in the first test mode, a first boosted voltage VPP1 is applied to the at least one selected word line (S121a), and a second boosted voltage VPP2 is applied to the at least two neighboring word lines (S123a). A first level of the first boosted voltage VPP1 may be higher than a second level of the second boosted voltage VPP2.

Referring to FIG. 2B, in the first test mode, a second boosted voltage VPP2 is applied to the at least one selected word line (S121b), and a first boosted voltage VPP1 is applied to the at least two neighboring word lines (S123b). A first level of the first boosted voltage VPP1 may be higher than a second level of the second boosted voltage VPP2.

The sequence of applying the first boosted voltage VPP1 and the second boosted voltage VPP2 is not limited thereto, and may be changed.

Figure 3A:
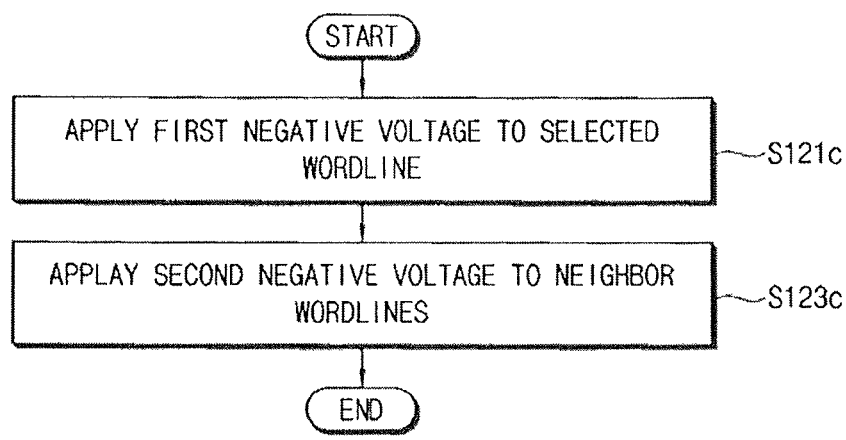

Referring to FIG. 3A, in a second test mode, a first negative voltage VBB1 is applied to the at least one selected word line (S121c), and a second negative voltage VBB2 is applied to the at least two neighboring word lines (S123c). A first level of the first negative voltage VBB1 may be lower than a second level of the second negative voltage VBB2.

Figure 3B:
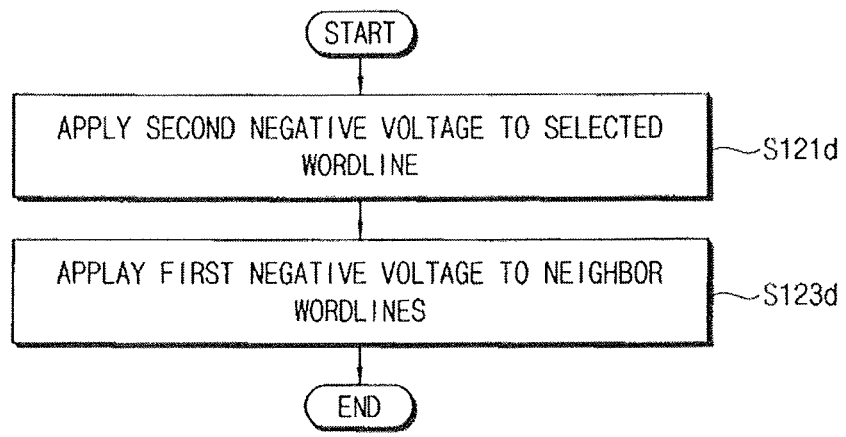

Referring to FIG. 3B, in the second test mode, a second negative voltage VBB2 is applied to the at least one selected word line (S121d), and a first negative voltage VBB1 is applied to the at least two neighboring word lines (S123d). A first level of the first negative voltage VBB1 may be lower than a second level of the second negative voltage VBB2.

The sequence of applying the first negative voltage VBB1 and the second negative voltage VBB2 is not limited thereto, and may be changed.

Figure 4:
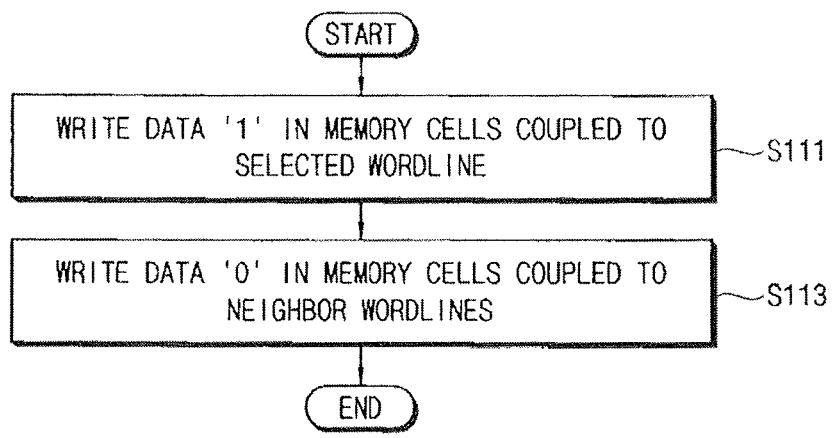
FIG. 4 is a flow chart illustrating the step S110 in FIG. 1 according to an exemplary embodiment of the present inventive concept.

FIG. 4 is a flow chart illustrating the step S110 in FIG. 1 according to an exemplary embodiment.

Referring to FIG. 4, first data having a high voltage level (data '1') is written in the selected memory cells coupled to the at least one selected word line (S111), and second data having a low voltage level (data '0') are written in the memory cells coupled to the at least two neighboring word lines (S113). Accordingly, when a plurality of memory cells are selected using a plurality of word lines, the memory cells have different data word line by word line.

Figure 5:
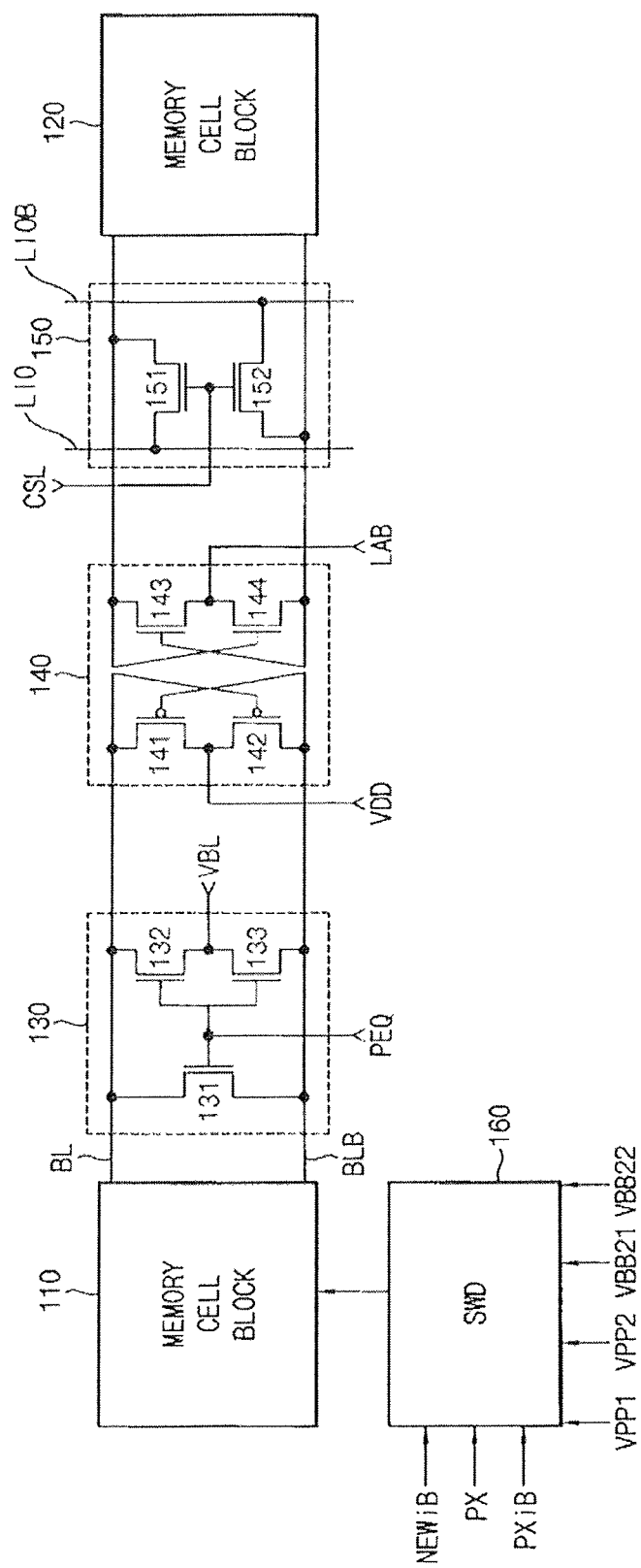
FIG. 5 is a circuit diagram illustrating a memory core of a semiconductor memory device to which a test method according to an exemplary embodiment is applied.

FIG. 5 is a circuit diagram illustrating a memory core of a semiconductor memory device according to an exemplary embodiment.

Figure 6:
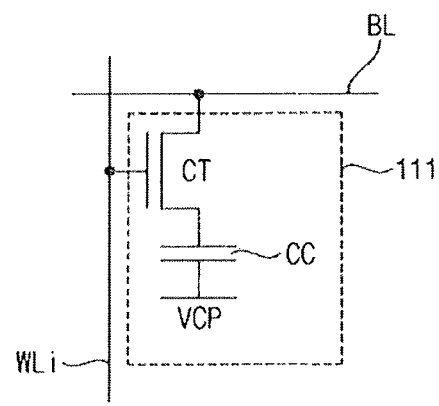
FIG. 6 is a circuit diagram illustrating a memory cell in the memory cell block in FIG. 5.

FIG. 6 is a circuit diagram illustrating a memory cell of a memory cell block in FIG. 5.

Referring to FIGS. 5 and 6, a memory core 10 of a semiconductor memory device includes memory cell blocks 110 and 120, an equalizing circuit 130, a bit-line sense amplifier 140, a column selection circuit 150 and a sub word line driver 160.

In FIG. 5, a pair of bit lines including a bit line BL and a complementary bit line BLB are disposed in a folded-bit-line architecture. For example, a pair of bit lines BL and BLB connected to the bit-line sense amplifier is wired in the same direction from the sense amplifier.

Each of the memory cell blocks 110 and 120 includes a plurality of memory cells. The plurality of the memory cells is coupled to a plurality of a bit-line pair (including the bit-line BL and the complementary bit-line BLB) and a plurality of word lines. In FIG. 5, for simplicity of description, a single bit-line pair is illustrated.

As illustrated in FIG. 6, a memory cell 111 is connected between a word line WLi and a bit line BL. The memory cell 111 includes a cell transistor CT and a cell capacitor CC which are connected to each other in series. The cell transistor CT has a first electrode connected to the bit line BL and a gate connected to the word line WLi. The cell capacitor CC has a first terminal connected to a second electrode of the cell transistor CT, and cell plate voltage VCP is applied to a second terminal of the cell capacitor CC.

The equalizing circuit 130 is connected to both the bit line BL and the complementary bit line BLB. The equalizing circuit 130 serves to maintain the bit-line BL and the complementary bit-line BLB at substantially the same potential in response to an equalization control signal PEQ.

The equalizing circuit 130 includes n-channel metal-oxide semiconductor (NMOS) transistors 131, 132, and 133. The NMOS transistor 131 is connected between the bit line BL and the complementary bit line BLB. The NMOS transistors 132 and 133 are connected in parallel with the NMOS transistor 131 between the bit line BL and the complementary bit line BLB. The NMOS transistor 132 is connected between the bit line BL and the NMOS transistor 133 and the NMOS transistor 133 is connected between the NMOS transistor 132 and the complementary bit line BLB. A bit-line precharge voltage VBL is applied to a common node 134 between the NMOS transistor 132 and the NMOS transistor 133. The equalization control signal PEQ is commonly applied to gates of the NMOS transistors 131, 132 and 133.

The equalizing circuit 130 precharges the bit line BL and the complementary bit-line BLB using the precharge voltage VBL and maintains the bit line BL and the complementary bit line BLB at substantially the same potential in response to the equalization control signal PEQ. When the equalization control signal PEQ is activated, the NMOS transistors 132 and 132 precharge the bit line BL and the complementary bit line BLB using the precharge voltage VBL, and the NMOS transistor 131 maintains the bit-line BL and the complementary bit line BLB at substantially the same potential by electrically connecting the bit line BL and the complementary bit line BLB.

The bit line sense amplifier 140 includes p-channel metal-oxide semiconductor (PMOS) transistors 141 and 142, and NMOS transistors 143 and 144. The PMOS transistors 141 and 142 sense the voltage difference between the bit line BL and the complementary bit line BLB, and amplify the voltage difference between the bit line BL and the complementary bit line BLB using supply voltage VDD. The PMOS transistor 141 is connected to the bit line BL and a gate connected to the complementary bit line BLB. The PMOS transistor 141 is also connected to the PMOS transistor 142 at a first common node 145. The PMOS transistor 142 is connected to the bit line BLB. A gate of the PMOS transistor 142 is connected to the bit line BL. The NMOS transistors 143 and 144 sense the voltage difference between the bit line BL and the complementary bit line BLB, and amplify the voltage difference between the bit line BL and the complementary bit line BLB in response to an amplification control signal LAB.

The column selection circuit 150 includes NMOS transistors 151 and 152. The NMOS transistor 151 is connected to both the bit line BL and the local input/output line LIO and has a gate to which a column selection signal CSL is applied. The NMOS transistor 152 is connected to both the complementary bit line BLB and a complementary local input/output line LIOB, and has a gate to which the column selection signal CSL is applied. The NMOS transistor 151 connects the bit line BL with the local input/output line LIO in response to the column select signal CSL, and the NMOS transistor 152 connects the complementary bit line BLB with the complementary local input/output line LIOB in response to the column selection signal CSL.

The sub word line driver 160 serves to drive corresponding word lines with the first and second boosted voltages VPP1 and VPP2. The sub word line driver 160 also drives corresponding word lines with the first and second negative voltages VBB1 and VBB2. The sub word line driver 160 operates in response to a word line enable signal NEWiB and first and second word line enable control signals PXi and PXiB. For example, the sub word line driver 160 drives a selected word line and its neighboring word lines with the first and second boosted voltages VPP1 and VPP2 in the first test mode after a data write operation. In addition, the sub word line driver 160 drives the selected word line and the neighboring word lines with the first and second negative voltages VBB1 and VBB2 in the second test mode after a data write operation.

Figure 7:
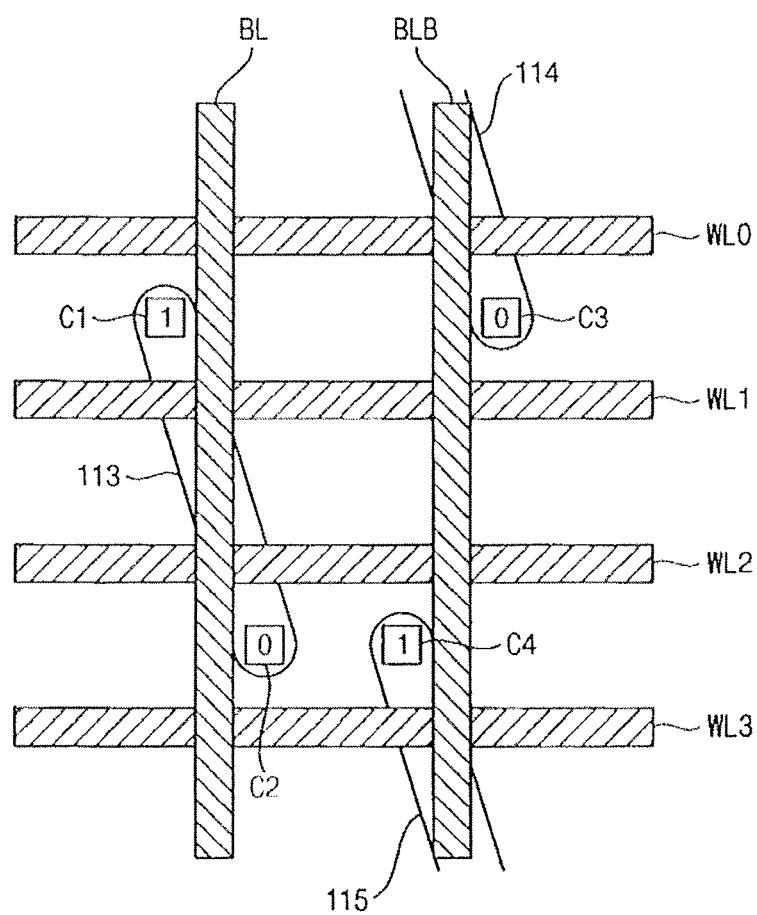
FIG. 7 shows a cell array illustrating a written data pattern of a semiconductor memory device according to an exemplary embodiment of the present inventive concept.

FIG. 7 shows a cell array illustrating a written data pattern of a semiconductor memory device according to an exemplary embodiment.

Referring to FIG. 7, the cell array is part of the memory cell block in FIG. 5. For simplicity of description, the cell array includes a four word lines WL0 to WL3, a pair of bit lines BL and BLB, and three active regions 113, 114, and 115. The cell array includes four cells C1 to C4 disposed in the three active regions 113, 114, and 115. Each of the four cells C1 to C4 stores data different from those of neighboring cells. For example, the cell C2 stores data '0', and its neighboring cells C1 and C4 store data '1'. Such data pattern that memory cells C1 to C4 is referred to as a row bar pattern.

To form the row bar pattern in the, a write operation is performed in a sequence of activating from a first word line WL0 to a fourth WL3 by alternating written data between data '0' and data '1'. For example, when a first word line WL0 is activated, the write operation writes data '0' to a third cell C3 that is coupled to the first word line WL0. When a second word line WL1 is activated, the write operation writes data '1' to a first cell C1. When a third word line WL2 is activated, the write operation writes data '0' to a second cell C2. When a fourth word line WL3 is activated, the write operation writes data '1' to a fourth cell C4.

Data '1' and data '0' are written in cells C1 and C2 disposed within the same active region 113. Data '1' and data '0' are written in cells C1 and C3 in different active regions 113 and 114. The cell C3 is coupled to the first word line WL0, and the cell C1 is coupled to the second word line WL1. In addition, data '0' and data '1' are written in cells C2 and C4 in different active regions 113 and 115. The cell C2 is coupled to a third word line WL2, and the cell C4 is coupled to a fourth word line WL3.

Figure 8:
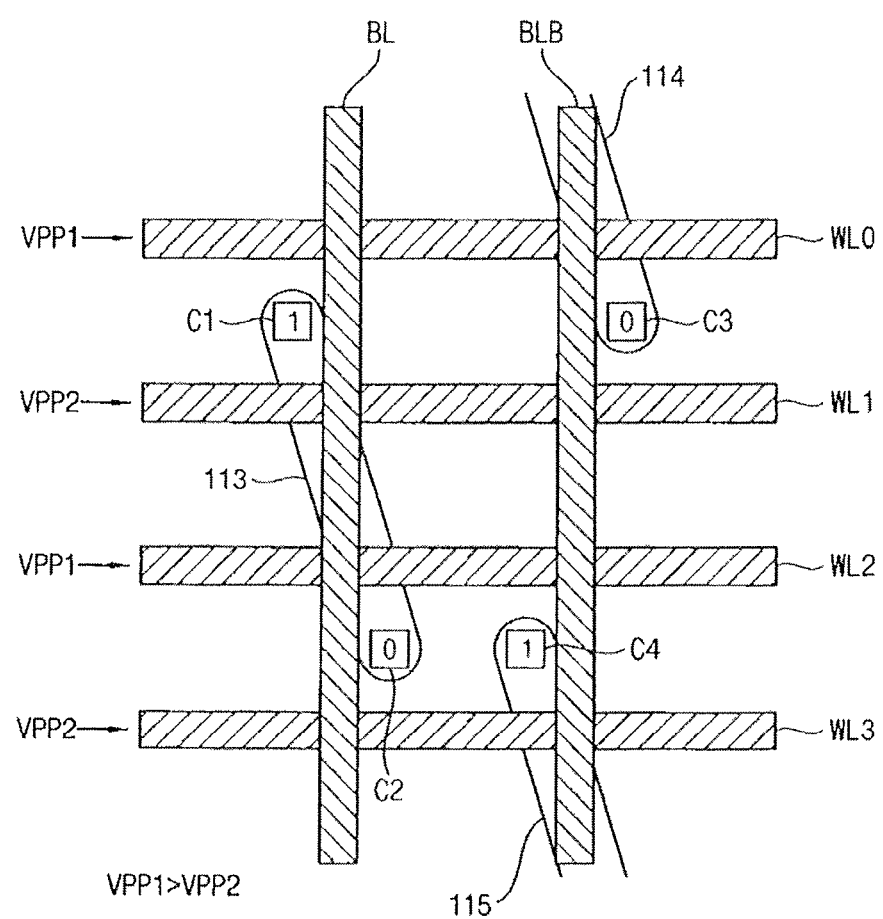
FIGS. 8 and 9 show a cell array illustrating a boosted voltage condition applied to word lines for a first test mode according to an exemplary embodiment of the present inventive concept.
Figure 9:
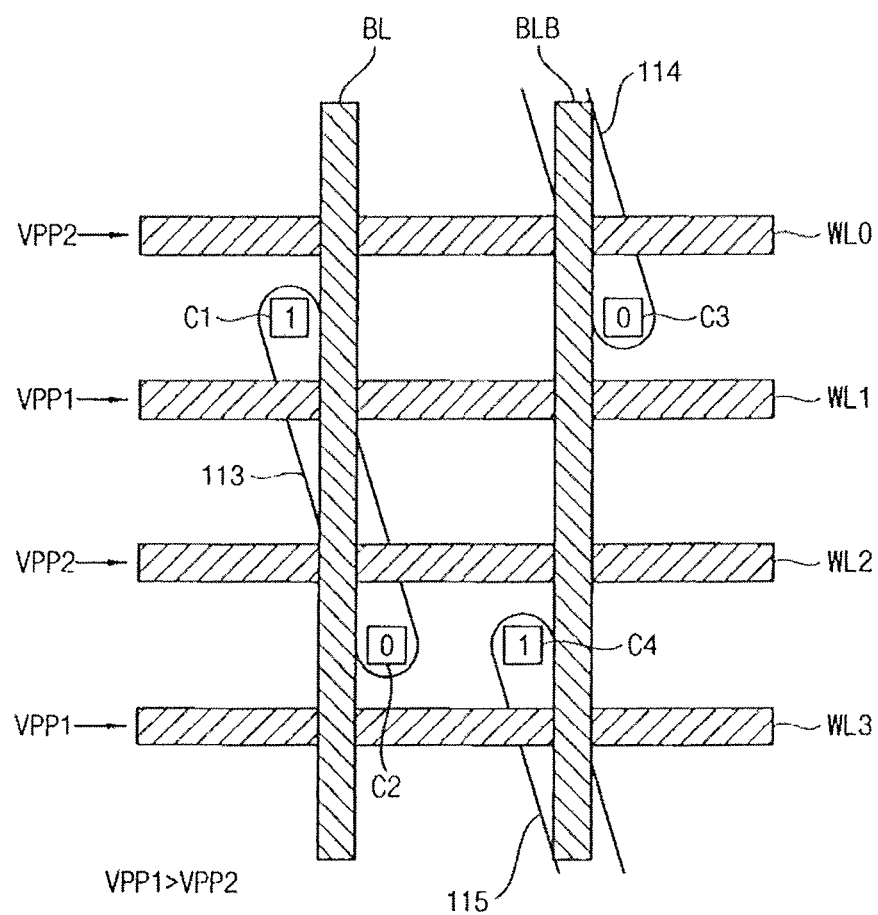

FIGS. 8 and 9 show a cell array illustrating a boosted voltage condition applied to word lines according to an exemplary embodiment of the present inventive concept;

Referring to FIG. 8, a second boosted voltage VPP2 is applied to the selected word lines WL1 and WL3 and a first boosted voltage VPP1 is applied to the neighboring word lines WL1 and WL2 in the first test mode. A first level of the first boosted voltage VPP1 may be higher than a second level of the second boosted voltage VPP2.

Referring to FIG. 9, the first boosted voltage VPP1 is applied to the selected word lines WL1 and WL3 and the second boosted voltage VPP2 is applied to the neighboring word lines WL1 and WL2 in the second test mode. The first level of the first boosted voltage VPP1 may be higher than the second level of the second boosted voltage VPP2.

When the data are written in the cells C1 to C4 as illustrated in FIG. 7 and the boosted voltages VPP1 and VPP2 having different levels are applied to the selected word lines WL1 and WL3 and the neighboring word lines WL1 and WL2 as illustrated in FIG. 8 or FIG. 9, the cells C1 and C4 coupled to the selected word lines WL1 and WL3 are influenced by the neighboring word lines WL0 and WL2. For example, the boosted voltages that is applied to the neighboring word lines WL1 and WL3 are coupled to cell transistors of the cells C1 and C4 thereby increasing leakage current of the cell transistors. In this case, sub threshold voltage leakage occurs through the cell transistor from a cell capacitor (refer to FIG. 6) to a bit line BL or a complementary bit line BLB. For the cell C1, leakage current flows through a corresponding cell transistor from the cell C1 to the bit line BL. The cell transistor threshold voltage of the cell C1 is affected by the boosted voltage of the first word line WL0. For the cell C4, leakage current flows through a corresponding cell transistor from the cell C4 to the complementary bit line BLB. The cell transistor threshold voltage of the cell C4 is affected by the boosted voltage of the first word line WL2. Accordingly, data stored in the cell capacitor of the cells C1 and C4 may be lost.

After the data are written in the cells C1 to C4 as illustrated in FIG. 7 and the boosted voltages VPP1 and VPP2 having different levels are applied to the selected word lines WL1 and WL3 and the neighboring word lines WL1 and WL2 as illustrated in FIG. 8 or FIG. 9, data is read from the memory cells C1 and C3 coupled to the selected word lines WL1 and WL3. If the memory cells C1 and C3 include cell transistors which are more influenced by the level of the neighboring word lines WL0 and WL2, the memory cells C1 and C3 are screened as defective cells using the boosted voltages VPP1 and VPP2.

Figure 10:
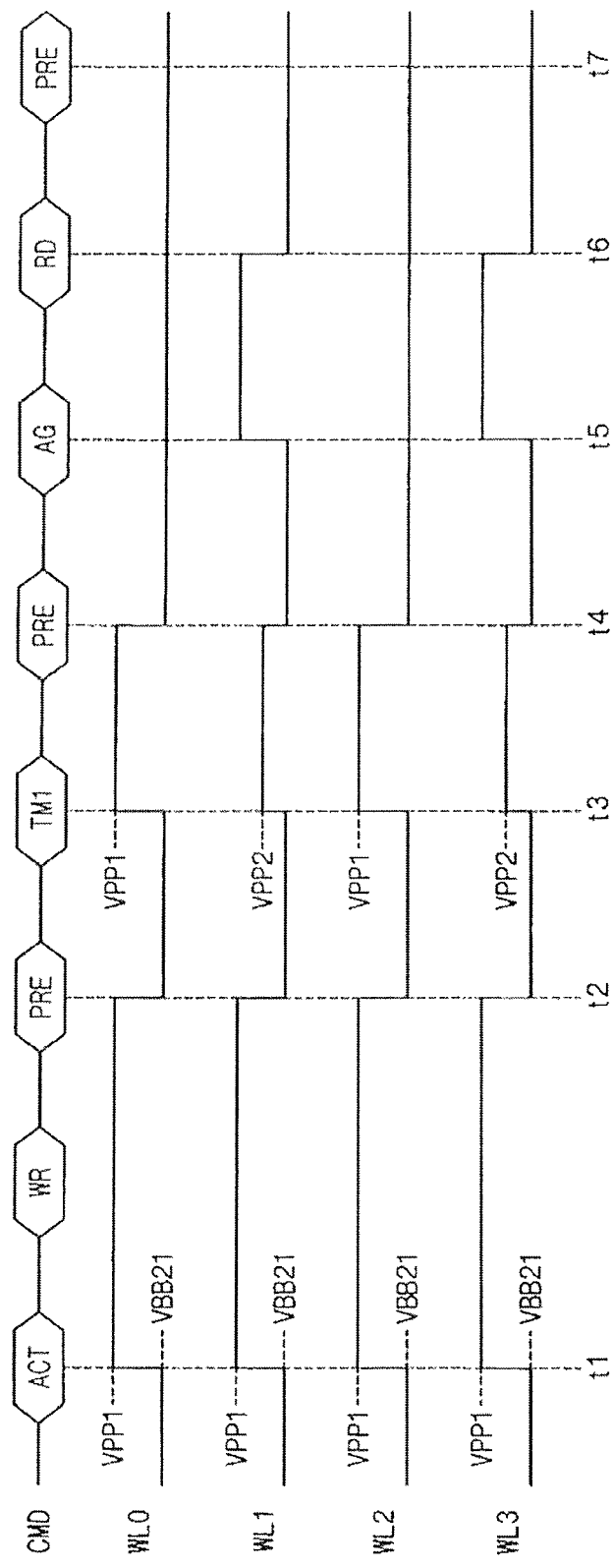
FIG. 10 is a timing diagram illustrating voltage levels of word lines for performing a first test mode according to an exemplary embodiment of the present inventive concept.

FIG. 10 is a timing diagram illustrating voltage levels of word lines if a semiconductor memory device is tested under a first test mode according to an exemplary embodiment of the present inventive concept.

FIG. 10 illustrates a timing diagram illustrating a method of applying voltages to the cells C1 to C4 of FIG. 7. The boosted voltages VPP1 and VPP2 having different levels are applied to the selected word lines WL1 and WL3 and the neighboring word lines WL1 and WL2 as illustrated in FIG. 8.

Referring to FIGS. 5 through 8 and FIG. 10, before timing (t1), the word lines WL0~WL3 are precharged to a level of a first negative voltage VBB21. At timing (t1), the word lines WL0~WL3 are activated to a level of a first boosted voltage VPP1 in response to an active command ACT, and data are written in the memory cells C1~C4 in response to a write command WR as in FIG. 7. At timing (t2), write operation is over in response to a precharge command PRE, and the WL0~WL3 are precharged to the level of the first negative voltage VBB21. At timing (t3), the second boosted voltage VPP2 is applied to the selected word lines WL1 and WL3 and the second boosted voltage VPP1 is applied to the neighboring word lines WL0 and WL2 in response to the first test mode TM1. At timing (t4), the WL0~WL3 are precharged to the level of the first negative voltage VBB21 in response to the precharge command PRE. At timing (t5), the first boosted voltage VPP1 is applied to selected word lines WL1 and WL3 in response to the active command ACT. At timing (t6), data are read from the memory cells C1 and C4 coupled to the selected word lines WL1 and WL3 in response to a read command RD. At timing (t7), the selected word lines WL1 and WL3 are precharged to the level of the first negative voltage VBB21 in response to the precharge command PRE. The selected word lines WL1 and WL3 are driven to the second boosted voltage VPP2 and the neighboring word lines WL0 and WL2 are driven to the first boosted voltage VPP1 higher than the second boosted voltage VPP2 during an interval t3~t4. Therefore, each threshold voltage of the cells C1 and C4 coupled to the selected word lines WL1 and WL3 is influenced by voltage levels of the neighboring word lines WL0 and WL2. When the cells C1 and C4 are weak cells whose cell transistors are more influenced by the voltage levels of the neighboring word lines WL0 and WL2, the cells C1 and C4 are screened as defective cells.

In FIG. 10, the selected word lines WL1 and WL3 are driven to the second boosted voltage VPP2 and the neighboring word lines WL0 and WL2 are driven to the first boosted voltage VPP1 in the first test mode TM1. The timing diagram of FIG. 10 is similarly applied to a case when the selected word lines WL1 and WL3 are driven to the first boosted voltage VPP1 and the neighboring word lines WL0 and WL2 are driven to the second boosted voltage VPP2.

Figure 11:
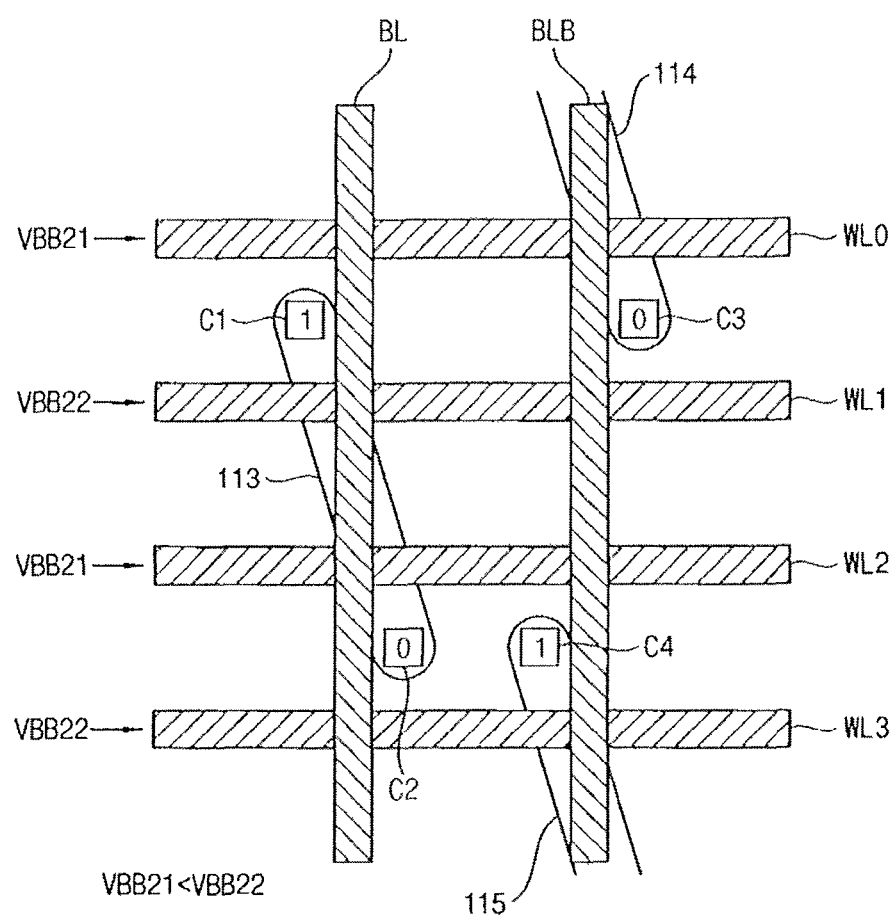
FIGS. 11 and 12 show a cell array illustrating a boosted voltage condition applied to word lines for a second test mode according to an exemplary embodiment of the present inventive concept.
Figure 12:
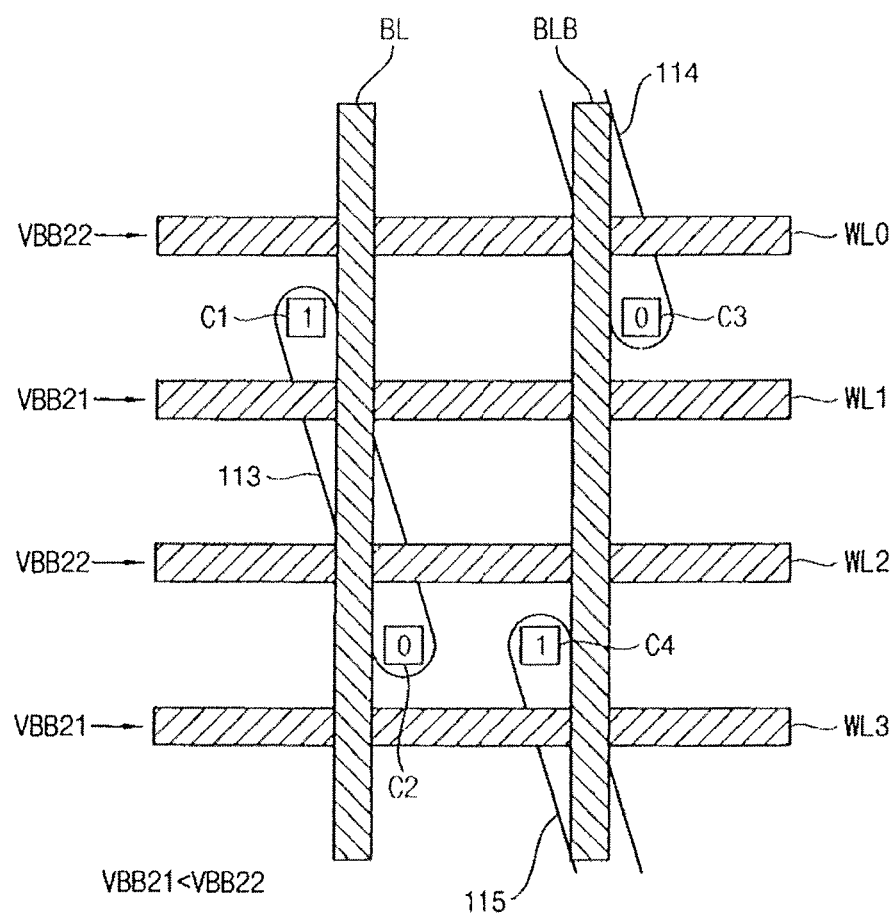

FIGS. 11 and 12 show a cell array illustrating a boosted voltage condition applied to word lines for a second test mode according to an exemplary embodiment.

Referring to FIG. 11, a second negative voltage VBB22 is applied to the selected word lines WL1 and WL3, and a first negative voltage VBB21 is applied to the neighboring word lines WL1 and WL2. A second level of the second negative voltage VBB22 may be higher than a first level of the first negative voltage VBB21.

Referring to FIG. 12, the first negative voltage VBB21 is applied to the selected word lines WL1 and WL3, and the second negative voltage VBB22 is applied to the neighboring word lines WL1 and WL2. The second level of the second negative voltage VBB22 may be higher than the first level of the first negative voltage VBB21.

When the data are written in the cells C1 to C4 as illustrated in FIG. 7 and the negative voltages VBB21 and VBB22 having different levels are applied to the selected word lines WL1 and WL3 and the neighboring word lines WL1 and WL2 as illustrated in FIG. 11 or FIG. 12, each threshold voltage of the cells C1 and C4 coupled to the selected word lines WL1 and WL3 are influenced by the voltage level of the neighboring word lines WL0 and WL2. In this case, sub threshold voltage leakage occur through a cell transistor to the extent that data stored in the cell capacitor may be lost. The leakage flows from a cell capacitor (refer to FIG. 6) of the corresponding memory cell to a corresponding bit line BL or a corresponding complementary bit line BLB.

After the data are written in the cells C1 to C4 as illustrated in FIG. 7 and the negative voltages VBB21 and VBB22 having different levels are applied to the selected word lines WL1 and WL3 and the neighboring word lines WL1 and WL2 as illustrated in FIG. 11 or FIG. 12, data is read from the memory cells C1 and C3 coupled to the selected word lines WL1 and WL3. When the cells C1 and C3 are weak cells, the second test mode screens the weak cells C1 and C3 as defective cells.

Figure 13:
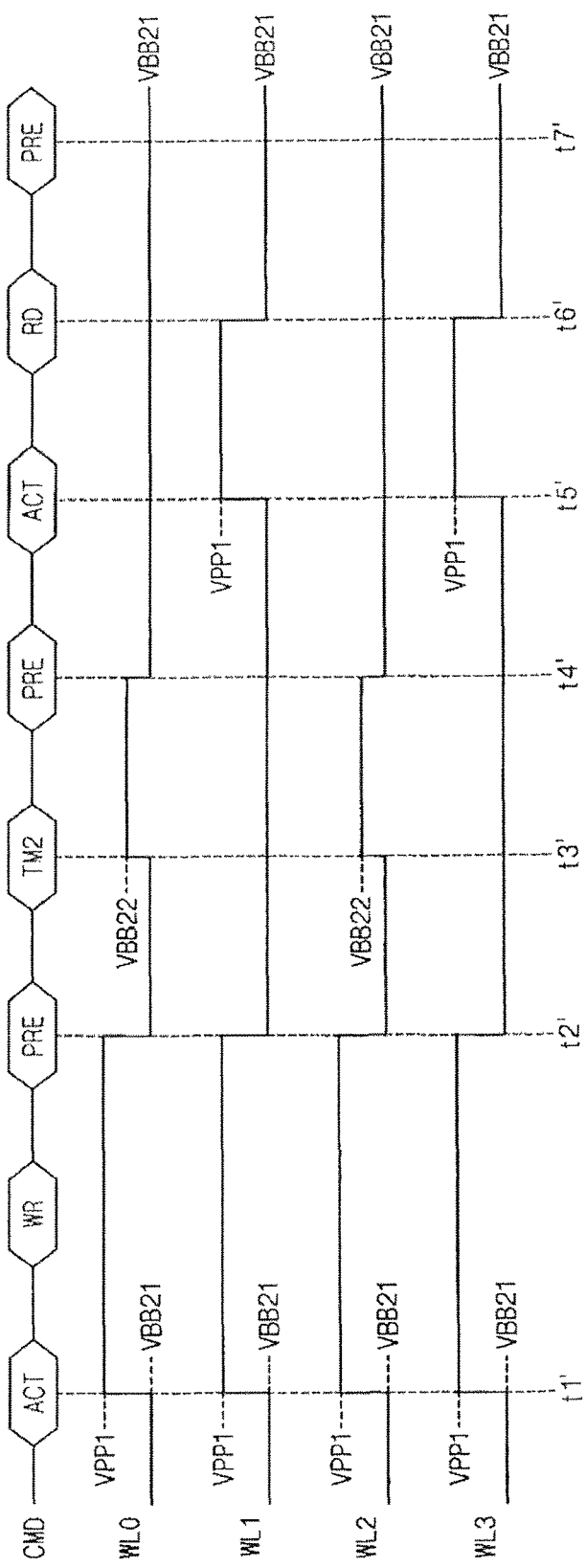
FIG. 13 is a timing diagram illustrating voltage levels of word lines for performing a second test mode according to an exemplary embodiment of the present inventive concept.

FIG. 13 is a timing diagram illustrating voltage levels of word lines if a semiconductor memory device is tested under a second test mode according to an exemplary embodiment.

FIG. 13 illustrates a timing diagram when the data are written in the cells C1 to C4 in FIG. 5 as illustrated in FIG. 7 and the negative voltages VBB21 and VBB22 having different levels are applied to the selected word lines WL1 and WL3 and the neighboring word lines WL1 and WL2 as illustrated in FIG. 11.

Referring to FIGS. 5 through 7, FIG. 11 and FIG. 13, before timing (t1'), the word lines WL0~WL3 are precharged to a level of a first negative voltage VBB21. At timing (t1'), the word lines WL0~WL3 are activated to a level of a first boosted voltage VPP1 in response to an active command ACT, and data are written in the memory cells C1 to C4 in response to a write command WR as in FIG. 7. At timing (t2'), write operation is over in response to a precharge command PRE, and the WL0 to WL3 are precharged to the level of the first negative voltage VBB21. At timing (t3'), the first negative voltage VBB21 is applied to the selected word lines WL1 and WL3 and the second negative voltage VBB22 is applied to the neighboring word lines WL0 and WL2 in response to the second test mode TM2. At timing (t4'), the WL0~WL3 are precharged to the level of the first negative voltage VBB21 in response to the precharge command PRE. At timing (t5'), the first boosted voltage VPP1 is applied to selected word lines WL1 and WL3 in response to the active command ACT. At timing (t6'), data is read from the memory cells C1 and C4 coupled to the selected word lines WL1 and WL3 in response to a read command RD. At timing (t7'), the selected word lines WL1 and WL3 are precharged to the level of the first negative voltage VBB21 in response to the precharge command PRE. The selected word lines WL1 and WL3 are driven to the first negative voltage VBB21 and the neighboring word lines WL0 and WL2 are driven to the second negative voltage VBB22 higher than the first negative voltage VBB21 during an interval between timing (t3') and time (t4'). Therefore, each threshold voltage of the cells C1 and C4 coupled to the selected word lines WL1 and WL3 is influenced by voltage levels of the neighboring word lines WL0 and WL2. When the cells C1 and C4 are weak cells, the second test mode TM2 screens the cells C1 and C4 as defective cells.

In FIG. 13, the selected word lines WL1 and WL3 are driven to the first negative voltage VBB21 and the neighboring word lines WL0 and WL2 are driven to the second negative voltage VBB22 in the second test mode TM2. However, the timing diagram of FIG. 13 is similarly applied to a case when the selected word lines WL1 and WL3 are driven to the second negative voltage VBB22 and the neighboring word lines WL0 and WL2 are driven to the first negative voltage VBB21.

In FIGS. 1 through 13, the at least one selected word line includes a plurality of odd word lines and the neighboring word lines include a plurality of even word lines. The first test mode TM1 and the second test mode TM2 also apply to at least one selected word line including a plurality of even word lines. To screen a plurality of memory cells of a memory block, the first test mode TM1 and the second test mode TM2 are applied to odd word lines of the memory block and even word lines of the memory block.

Figure 14:
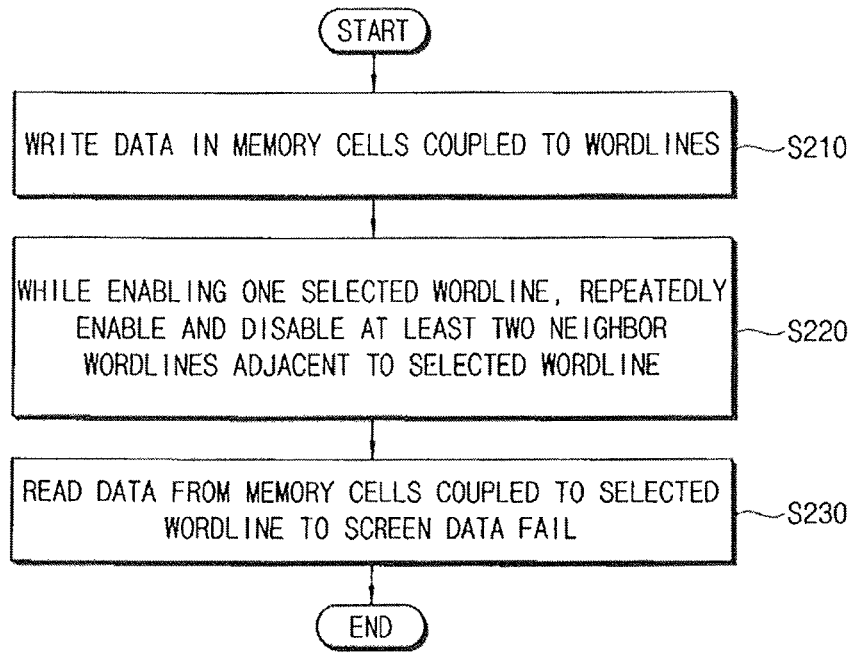
FIG. 14 is a flow chart illustrating a method of testing a semiconductor memory device according to an exemplary embodiment of the present inventive concept.

FIG. 14 is a flow chart illustrating a method of testing a semiconductor memory device according to an exemplary embodiment.

Referring to FIG. 14, in a method of testing a semiconductor memory device, data is written in a plurality of memory cells coupled to a plurality of word lines and a pair of bit-lines (S210). The plurality of memory cells are included in a memory cell block of the semiconductor memory device.

While at least one of the word lines is selected and the selected word line is deactivated, at least two neighboring word lines adjacent to the at least one selected word line are repeatedly and alternately activated and deactivated (S220). When the at least two neighboring word lines are deactivated, a voltage applied to the at least two neighboring word lines may be different from a voltage applied to the selected word line that is deactivated. That is, a first negative voltage may be applied to the selected word line and the second negative voltage higher than the first negative voltage may be applied to the neighboring word lines when the neighboring word lines are to be deactivated.

When the selected word line is deactivated and the neighboring word lines are repeatedly and alternately activated and deactivated after the data are written in the memory cells, threshold voltage of selected memory cells coupled to the selected word line is influenced by voltage levels of the neighboring word lines and the threshold voltage of the selected memory cells is lowered. When the threshold voltage of the selected memory cells is lowered, charges stored in a cell capacitor coupled to a cell transistor leaks through the cell transistor to the extent that data fail occurs in a read operation. The leakage occurs because neighboring gate effect is increased as two adjacent word lines are close to each other. The neighboring gate effect disturbs adjacent word line voltages.

After the selected word line is deactivated and the neighboring word lines are repeatedly and alternately activated and deactivated, data of the memory cell are read to screen defective memory cells having data fail (230).

Figure 15:
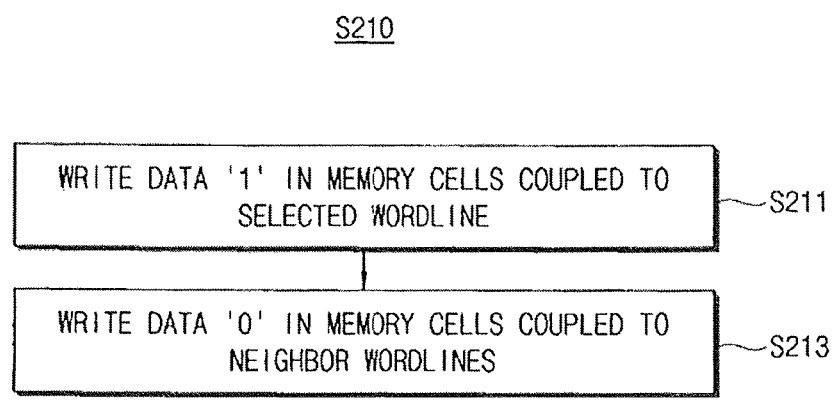
FIG. 15 is a flow chart illustrating the step S210 in FIG. 14 according to an exemplary embodiment of the present inventive concept.

FIG. 15 is a flow chart illustrating the step S210 in FIG. 14 according to an exemplary embodiment.

Referring to FIG. 15, for writing data in a plurality of memory cells, first data having data '1' is written in the selected memory cells coupled to the at least one selected word line (S211), and second data having data '0' is written in the memory cells coupled to the at least two neighboring word lines (S213).

Figure 16:
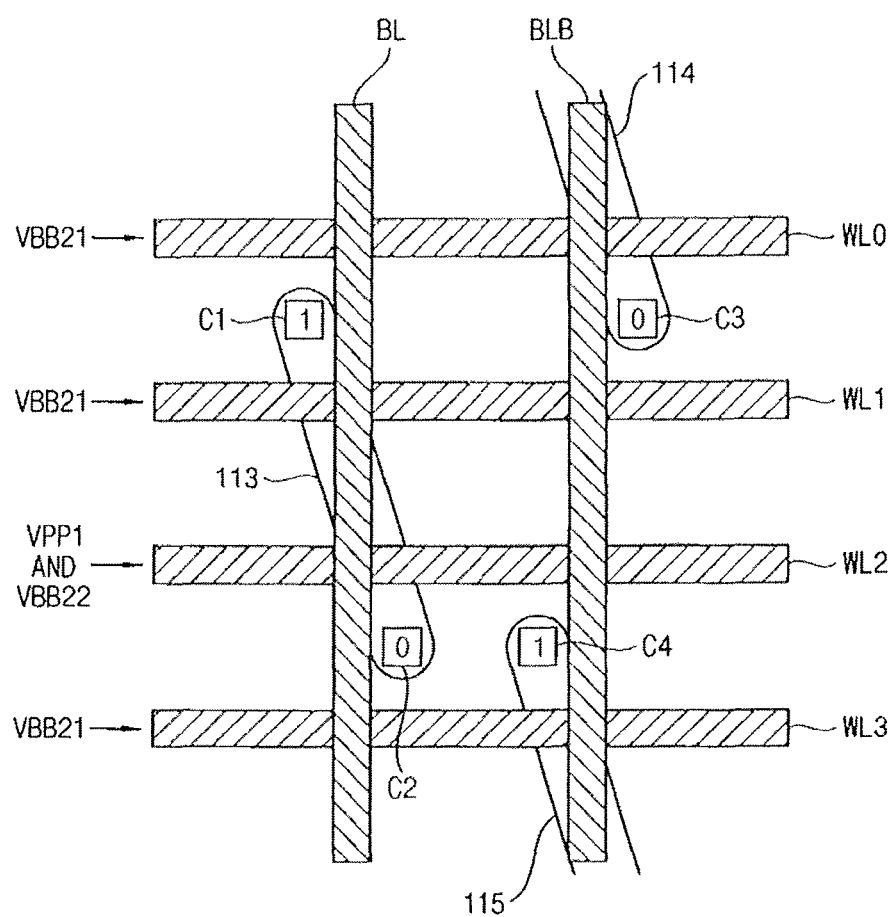
FIG. 16 shows a cell array illustrating a boosted voltage condition applied to word lines according to an exemplary embodiment of the present inventive concept.

FIG. 16 shows a cell array illustrating a boosted voltage condition applied to word lines according to the test method of FIG. 15. The test method of FIG. 15 is applied to the semiconductor memory device of FIG. 5.

Referring to FIG. 16, part of the memory cell block in FIG. 5 is illustrated. The memory cell block includes word lines WL0 to WL3, a pair of bit lines including a bit-line BL and a complementary bit-line BLB and a plurality of active regions 113, 114 and 115. Data '1' is written in the memory cell C1 coupled to the selected word line WL1, and data '0' is written in the memory cell C2 coupled to the neighboring word line WL2. Data '0' and data '1' are written in the memory cells C3 and C4 coupled to the word lines WL0 and WL3. After data are written in the memory cells, the selected word line WL1 and its neighboring word lines WL0 and WL3 are precharged to the first negative voltage VBB21. Then, the selected word line WL1 is deactivated. The first boosted voltage VPP1 and the second negative voltage VBB22 are repeatedly and alternately applied to the neighboring word line WL2. For example, the neighboring word line WL2 is disturbed by being repeatedly and alternately activated and deactivated while the selected word line WL1 is deactivated. When the neighboring word line WL2 is repeatedly activated and deactivated, a cell transistor of the memory cell C1 coupled to the selected word line WL1 is influenced by such disturbance, and the threshold voltage of the cell transistor of the memory cell C1 is lowered. The selected word-line WL1 is activated for a read operation. When the cell C1 is weak cell, the test method using the disturbance of the neighboring word line WL2 screens the cell C1 as a defective cell.

Figure 17:
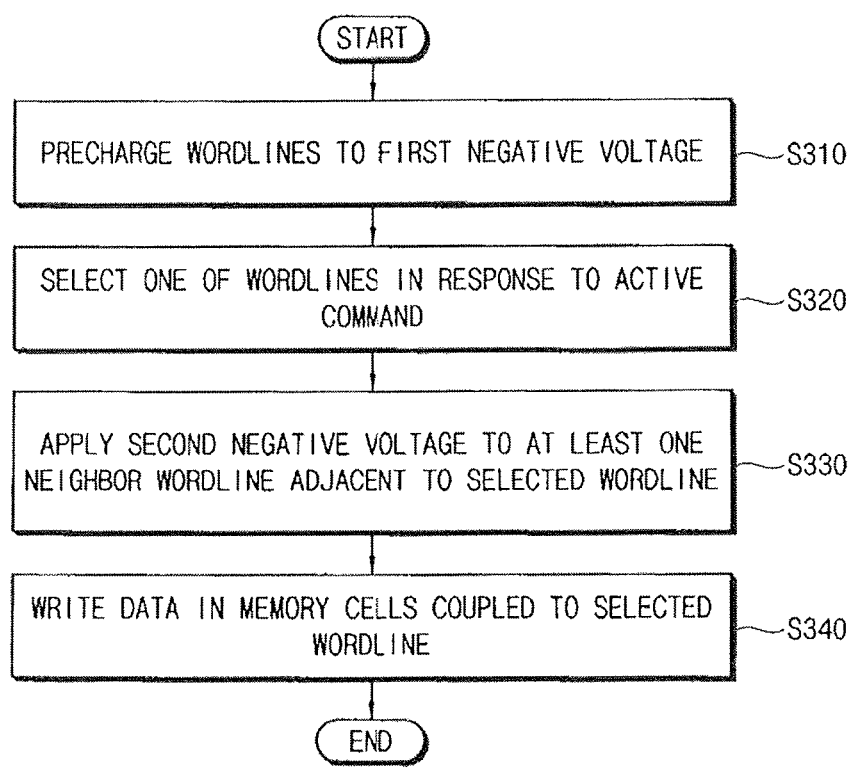
FIG. 17 is a flow chart illustrating a method of operating a semiconductor memory device according to an exemplary embodiment of the present inventive concept.

FIG. 17 is a flow chart illustrating a method of operating a semiconductor memory device according to an exemplary embodiment.

Referring to FIG. 17, a plurality of word lines is precharged to a first negative voltage VBB21 (S310). The cells are included in a memory cell block of the semiconductor memory device. One word line is selected in response to an active command (S320). In response to the active command, a first boosted voltage is applied to the selected word line. While the first boosted voltage is applied to the selected word line, a second negative voltage VBB22 having different from the first negative voltage VBB21 is applied to at least one neighboring word line adjacent to the selected word line (S330). Data is written in the memory cells coupled to the selected word line (S340).

In the method of operating a semiconductor memory device of FIG. 17, when data is written in the memory cells, voltage levels of the neighboring word lines adjacent to the selected word line are increased to be higher than the precharge voltage level of other word lines while the selected word line is activated. Threshold voltage of a cell transistor of each memory cell may hinder a write operation. The threshold voltage of the cell transistor tends to increase as the voltage level of the neighboring word line is low. Therefore, the increased precharge voltage level of other word lines adjacent to the selected word line may facilitate a write operation on the selected word line.

Figure 18A:
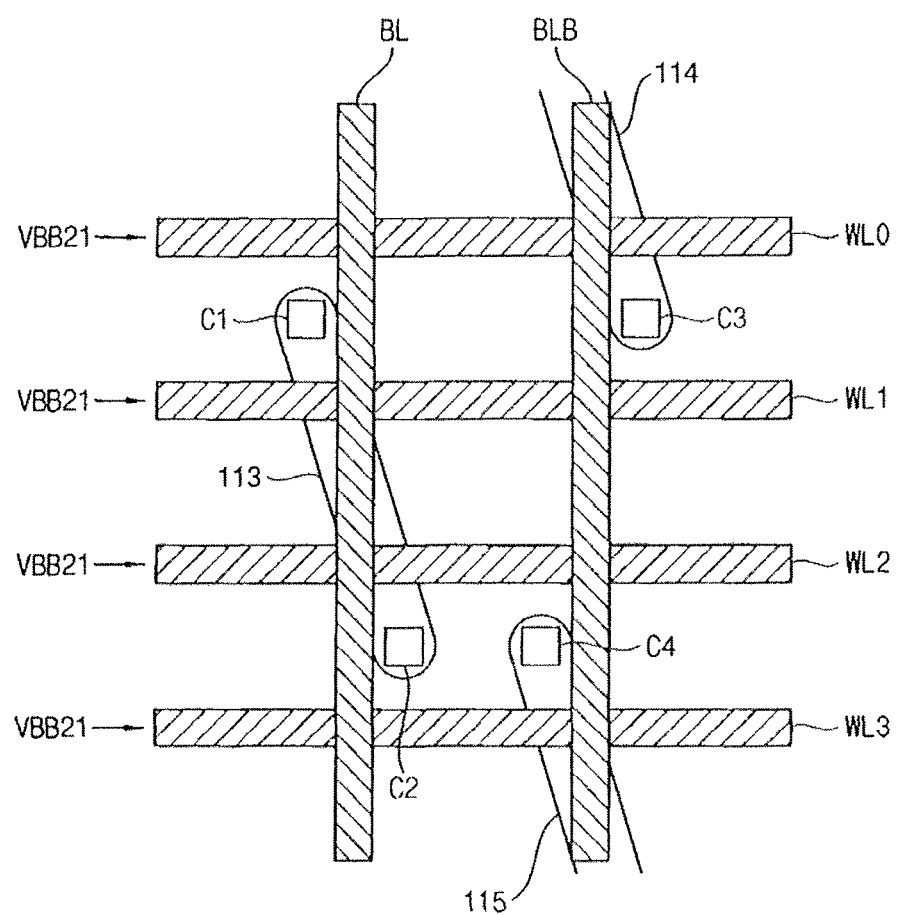
FIGS. 18A and 18B illustrate that the operating method of FIG. 17 is applied to the semiconductor memory device of FIG. 5 of the present inventive concept.
Figure 18B:
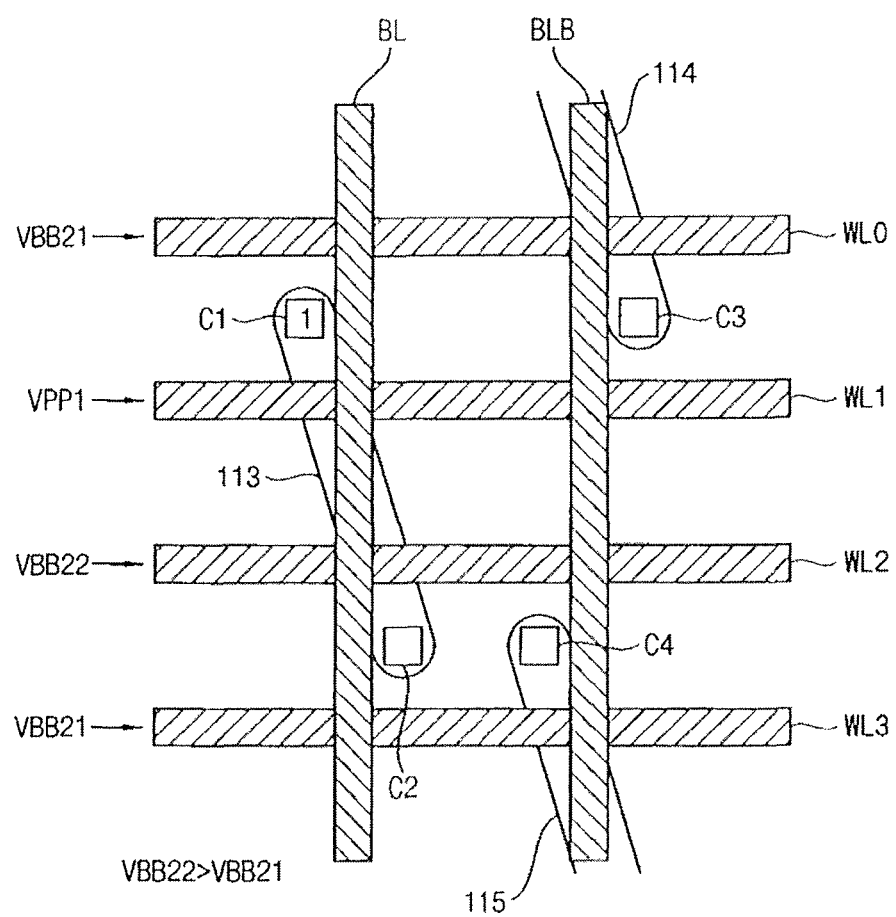

FIGS. 18A and 18B show a cell array illustrating a boosted voltage condition applied to word lines according to the test method of FIG. 17. The test method of FIG. 17 is applied to the semiconductor memory device of FIG. 5.

Referring to FIGS. 18A and 18B, part of the memory cell block in FIG. 5 is illustrated. The memory cell block includes word lines WL0 to WL3, a pair of bit lines including a bit-line BL and a complementary bit-line BLB and a plurality of active regions 113, 114 and 115. In the test method of FIG. 15, data '1' is written in the memory cell C1 coupled to the selected word line WL1, and data '0' is written in the memory cell C2 coupled to the neighboring word line WL2.

The word lines WL0 to WL3 are precharged to the first negative voltage VBB21 as in FIG. 18A.

The word line WL1 is selected by applying the first boosted voltage VPP1 to the word line WL1. The word line WL1 is activated as in FIG. 18B. While the first boosted voltage VPP1 is applied to the word line WL1, the second negative voltage VBB22 different from the precharge voltage VBB21 of the other word lines WL0 and WL3 is applied to the word line WL2 adjacent to the selected word line WL1. The level of the second negative voltage VBB22 may be higher than the level of the first negative voltage VBB21. Data is written in the memory cell C1 coupled to the selected word line WL1. When the data is written in the memory cell C1 coupled to the word line WL1, the data write operation is performed when the neighboring word line WL2 is in a precharge voltage level higher than the precharge voltage level of the other word lines WL0 and WL3.

Figure 19:
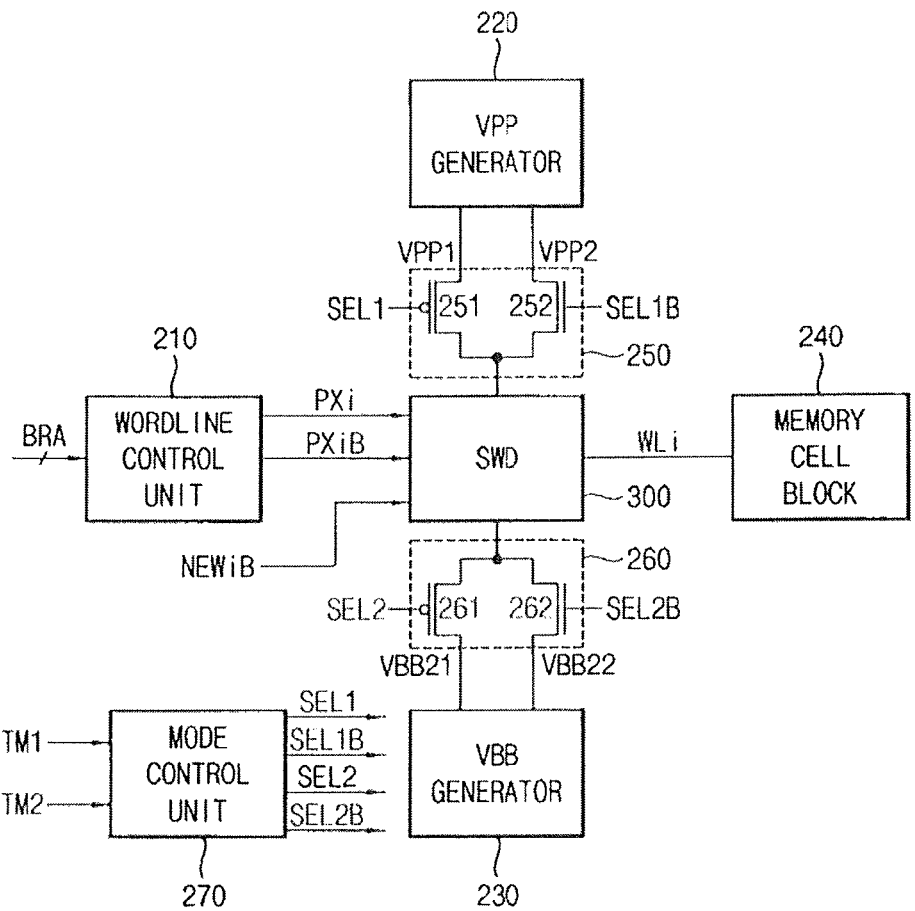
FIG. 19 is a block diagram illustrating a portion of a semiconductor memory device according to an exemplary embodiment of the present inventive concept.

FIG. 19 is a block diagram illustrating a semiconductor memory device according to an exemplary embodiment.

Referring to FIG. 19, a semiconductor memory device 200 includes a word line control unit 210, at least one memory cell block 240, a boosted voltage generator 220, a negative voltage generator 230, a word line driver 300, switching units 250 and 260 and a mode control unit 270.

The memory cell block 240 includes a plurality of memory cells coupled to a plurality of word lines WL. Each memory cell stores data. The boosted voltage generator 220 generates a first boosted voltage VPP1 and a second boosted voltage VPP2. The first boosted voltage VPP1 and the second boosted voltage VPP2 have different voltage levels from each other. The boosted voltages VPP1 and VPP2 are provided to the sub word line driver 300 using the first switching unit 250. The negative voltage generator 230 generates first and second negative voltages VBB21 and VBB22. The negative voltages VBB21 and VBB22 have different voltage levels from each other. The negative voltages VBB21 and VBB22 are provided to the sub word line driver 300 using the second switching unit 260. The first switching unit 250 provides one of the first and second boosted voltages VPP1 and VPP2 to the sub word line driver 300 in response to first selection and complementary selection signal SEL1 and SEL1B. The second switching unit 260 provides one of the first and second negative voltages VBB21 and VBB22 to the sub word line driver 300 in response to second selection and complementary selection signal SEL2 and SEL2B.

The first switching unit 250 includes a PMOS transistor 251 and an NMOS transistor 252. The PMOS transistor 251 selectively provides the first boosted voltage VPP1 to the sub word line driver 300 in response to the first selection signal SEL1. The NMOS transistor 252 selectively provides the second boosted voltage VPP2 to the sub word line driver 300 in response to the first complementary selection signal SEL1B. The second switching unit 260 includes a PMOS transistor 261 and an NMOS transistor 262. The PMOS transistor 261 selectively provides the first negative voltage VBB21 to the sub word line driver 300 in response to the second selection signal SEL2. The NMOS transistor 262 selectively provides the second negative voltage VBB22 to the sub word line driver 300 in response to the second complementary selection signal SEL2B.

The word line control unit 210 receives decoded row address signal DRA, and outputs first and second word line enable control signals PXi and PXiB to the sub word line driver 300. The mode control unit 270 generates the first selection and complementary selection signal SEL1 and SEL1B and the second selection and complementary selection signal SEL2 and SEL2B for controlling the first and second switching units 250 and 260 in response to test mode signals TM1 and TM2.

The sub word line driver 300 includes a plurality of sub word line drivers. Each sub word line driver drives a corresponding word line WLi of the memory cell block 240.

In a first test mode where the first test mode signal TM1 is activated and the second test mode signal TM2 is deactivated, the mode control unit 270 provides the first selection and complementary selection signal SELL and SEL1B to the first switching unit 250 so that a test is performed as described with reference to FIGS. 1 through 2B.

In a second test mode where the first test mode signal TM1 is deactivated and the second test mode signal TM2 is activated, the mode control unit 270 provides the second selection and complementary selection signal SEL2 and SEL2B to the second switching unit 260 so that a test is performed as described with reference to FIGS. 1, 3A and 3B.

In a third test mode where the first test mode signal TM1 is deactivated and the second test mode signal TM2 is deactivated in a normal mode, the mode control unit 270 provides first selection and complementary selection signal SEL1 and SEL1B to the first switching unit 250 and provides the second selection and complementary selection signal SEL2 and SEL2B to the second switching unit 260 so that a write operation is performed as described with reference to FIGS. 17 through 18B is performed.

Figure 20:
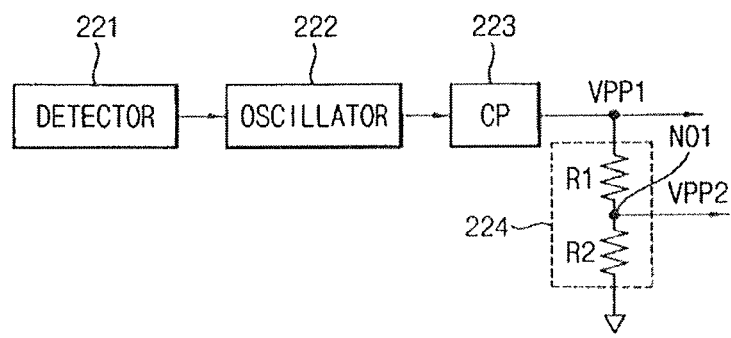
FIG. 20 is a block diagram illustrating an example of the boosted voltage generator in FIG. 19 according to an exemplary embodiment of the present inventive concept.

FIG. 20 is a block diagram illustrating a boosted voltage generator of FIG. 19 according to an exemplary embodiment.

Referring to FIG. 20, the boosted voltage generator 220 includes a detector 221, an oscillator 222, a charge pump 223 and a voltage divider 224.

The detector 221 detects a voltage level for generating the first and second boosted voltages VPP1 and VPP2. The oscillator 222 operates in response to the detected voltage level by the detector 222 and generates pulse signals in complementary relationship with the detected voltage level. The charge pump 223 performs pumping operation in response to the pulse signals to generate the first boosted voltage VPP1. The voltage divider 224 includes first and second resistors R1 and R2 connected in series at an output node NO1 between an output of the charge pump 223 and ground voltage, and the voltage divider 224 divides the first boosted voltage VPP1 to provide the second boosted voltage VPP2 at the output node NO1.

Figure 21:
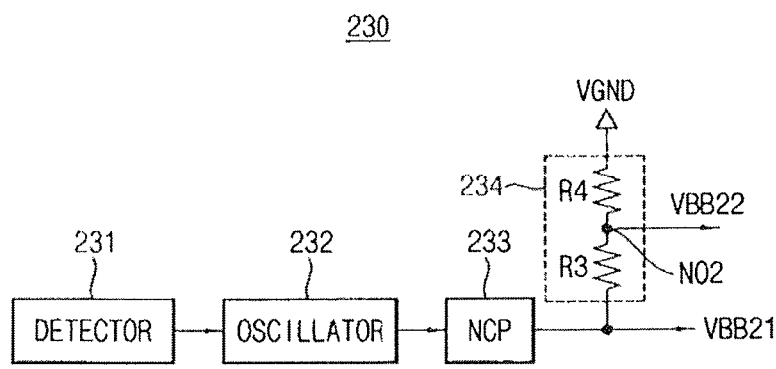
FIG. 21 is a block diagram illustrating an example of the negative voltage generator in FIG. 19 according to an exemplary embodiment of the present inventive concept.

FIG. 21 is a block diagram illustrating the negative voltage generator of FIG. 19 according to an exemplary embodiment.

Referring to FIG. 21, the negative voltage generator 230 includes a detector 231, an oscillator 232, a negative charge pump 233 and a voltage divider 234.

The detector 231 detects a voltage level for generating the first and second negative voltages VBB21 and VBB22. The oscillator 232 operates in response to the detected voltage level by the detector 232 and generates pulse signals in complementary relationship with the detected voltage level. The negative charge pump 233 performs pumping operation in response to the pulse signals to generate the first negative voltage VBB21. The voltage divider 234 includes third and fourth resistors R3 and R4 connected in series at an output node NO2 between an output of the negative charge pump 233 and a ground voltage VGND, and the voltage divider 234 divides the first negative voltage VBB21 to provide the second negative voltage VBB22 at the output node NO2.

Figure 22:
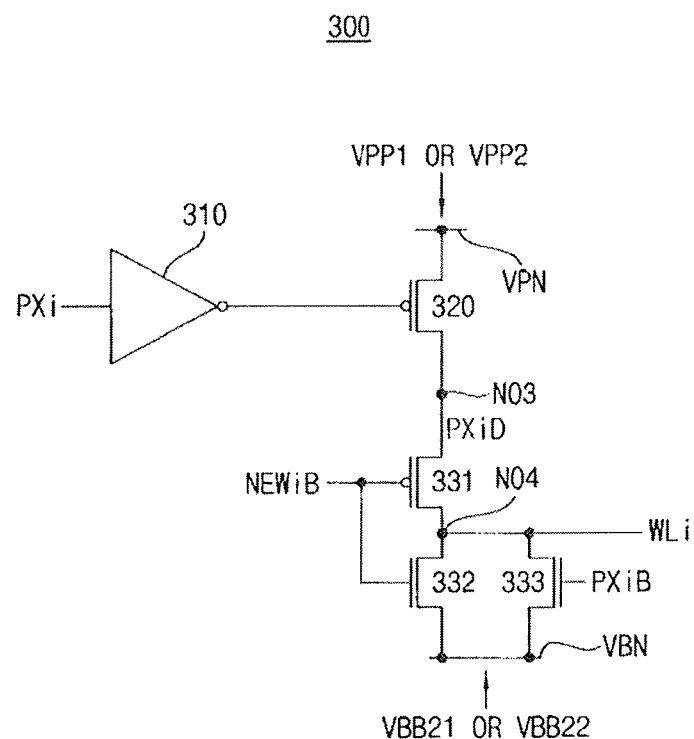
FIG. 22 is a circuit diagram illustrating an example of the sub word line driver in FIG. 19 according to an exemplary embodiment of the present inventive concept.

FIG. 22 is a circuit diagram illustrating a sub word line driver of FIG. 19 according to an exemplary embodiment.

Referring to FIG. 22, the sub word line driver 300 includes an inverter 310, PMOS transistors 320 and 331, and NMOS transistors 332 and 333. The PMOS transistor 320 has a source connected to a boosted terminal VPN, a gate receiving an output of the inverter 310 and a drain connected to a boosted node NO3. The PMOS transistor 331 has a source connected to the boosted node NO3, a gate receiving a word line enable signal NEWiB and a drain connected to an enable node NO4. The NMOS transistor 332 has a drain connected to the enable node NO4, gate receiving the word line enable signal NEWiB and a source connected to a negative voltage terminal VBN. The NMOS transistor 333 has a drain connected to the enable node NO4, gate receiving the second word line enable control signal PXiB and a source connected to the negative voltage terminal VBN.

The boosted terminal VPN receives one of the first and the second boosted voltage VPP1 and VPP2 according to an operation mode, and the negative voltage terminal VBN receives one of the first and the second negative voltages VBB21 and VBB22 (negative voltage) according to an operation mode.

The PMOS transistor 320 receives the boosted voltage VPP, and transfers the boosted voltage to the boost node NO3 in response to the first word line enable control signal PXi. The PMOS transistor 331 receives the boosted voltage from the PMOS transistor 331 through a source and enables a corresponding word line WLi connected to the enable node NO4 with the boosted voltage in response to the word line enable signal NEWiB.

The NMOS transistor 332 and the NMOS transistor 333 each receives a ground voltage through a source terminal. The NMOS transistor 332 transfers the negative voltage to the enable node NO4 in response to the word line enable signal NEWiB, and the NMOS transistor 333 disables the corresponding word line WLi connected to the enable node NO4 with the negative voltage in response to the second word line enable control signal PXiB.

Figure 23:
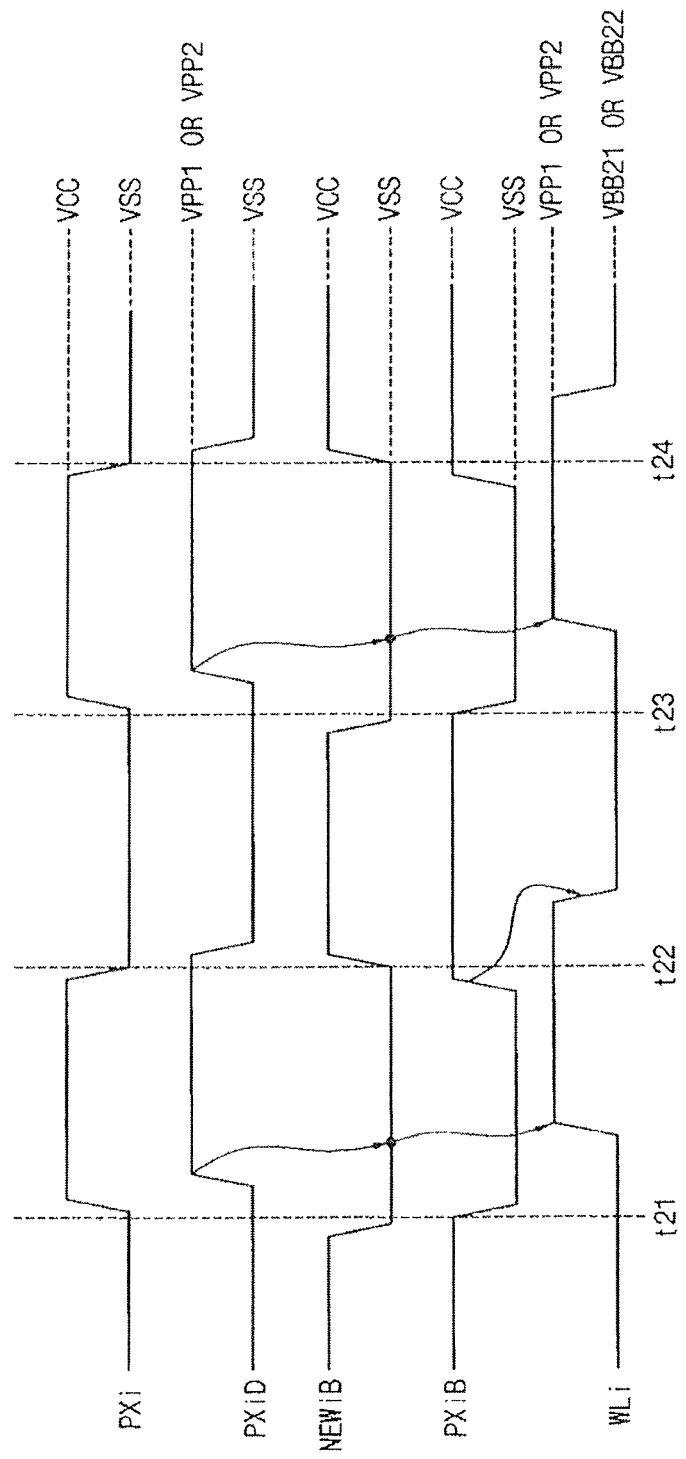
FIG. 23 is a timing diagram illustrating an operation of the semiconductor memory device of FIG. 21 according to an exemplary embodiment of the present inventive concept.

FIG. 23 is a timing diagram illustrating an operation of the word line in the semiconductor memory device of FIG. 21 according to an exemplary embodiment.

Referring to FIGS. 21 through 23, the first word line enable control signal PXi is in a logic low level initially. The first word line enable signal PXi changes to a logic high level VCC at timing t21 and t23 when the corresponding word line is enabled in response to a row address. The first word line enable signal PXi changes to a logic low level VSS at timing t22 and t24 when other word lines are enabled.

A boosted node voltage signal PXiD is in a logic low level initially. The boosted node voltage signal PXiD changes to the boosted voltages VPP1 or VPP2 at timing t21 and t23 when first word line enable control signal PXi changes to the logic high VCC. The boosted node voltage signal PXiD changes to the ground voltage at timing t22 and t24 when first word line enable control signal PXi changes to the logic low VSS level.

At timing t21 and t23, the word line enable signal NEWiB changes to the logic low level VSS when the row decoder activates the corresponding word line WLi. The word line enable signal NEWiB changes to the logic low level VSS at timing t22 and t24 when other word lines are enabled.

At timing t21 and t22, the word line enable control signal PXiB changes to the logic low level VSS. The corresponding word line WLi is enabled after the word line enable control signal PXiB changes to the logic low level VSS. When other word lines are enabled, the second word line enable control signal PXiB changes to the high logic level VCC at timing t22 and t24.

The corresponding word line WLi is initially maintained at the negative voltage level VBB21 or VBB22 in response to the second word line enable control signal PXiB. The boost node voltage signal PXiD is activated at a time after the word line enable signal NEWiB changes to the logic low level at timing t21 and t23. When other word-lines are activated and the word line enable bar signal NEWiB transitions to the logic high level at each timing t22 and t24, the corresponding word line signal WL is disabled to the ground voltage VSS in response to the second word line enable control signal PXiB.

Therefore, the sub word line driver 300 according to an exemplary embodiment may enable the corresponding word line WLi with one of the first and second boosted voltages VPP1 and VPP2 or may disable the corresponding word line WLi with one of the first and second negative voltages VBB21 and Vbb22 according to the operation mode.

Figure 24:
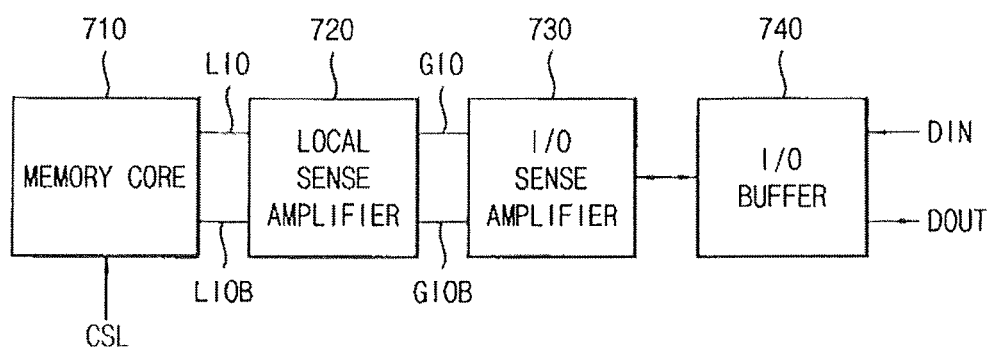
FIG. 24 is a block diagram illustrating a semiconductor memory device according to an exemplary embodiment of the present inventive concept.

FIG. 24 is a block diagram illustrating a semiconductor memory device according to an exemplary embodiment.

Referring to FIG. 24, the semiconductor memory device 700 includes a memory core 710, a local sense amplifier 720, an input/output sense amplifier 730, and an input/output buffer 740.

The memory core 710 includes the memory core 10 of FIG. 5. The memory core 710 drives the selected word line and the neighboring word line adjacent to the selected word line with different voltage levels to screen potential weak cells in a test mode. The memory core 710 also increases precharge voltage of the neighboring word line when the data are written in the memory cells coupled to the selected word line to perform a write operation. The local sense amplifier 720 amplifies the voltage difference between a local input/output line pair LIO and LIOB and provides the amplified voltage to a global input/output line pair GIO and GIOB. The input/output sense amplifier 730 amplifies the global input/output line pair GIO or GIOB. The input/output buffer 740 buffers and outputs the output of the input/output sense amplifier 730, or buffers input data DIN. The output of the input/output buffer 740 is provided to the outside of the semiconductor memory device through an output pad (not shown).

The semiconductor memory device 700 of FIG. 24 includes the word line control unit 210, the at least one memory cell block 240, the boosted voltage generator 220, the negative voltage generator 230, the switching units 250 and 260 and the mode control unit 270 of the FIG. 19.

Figure 25:
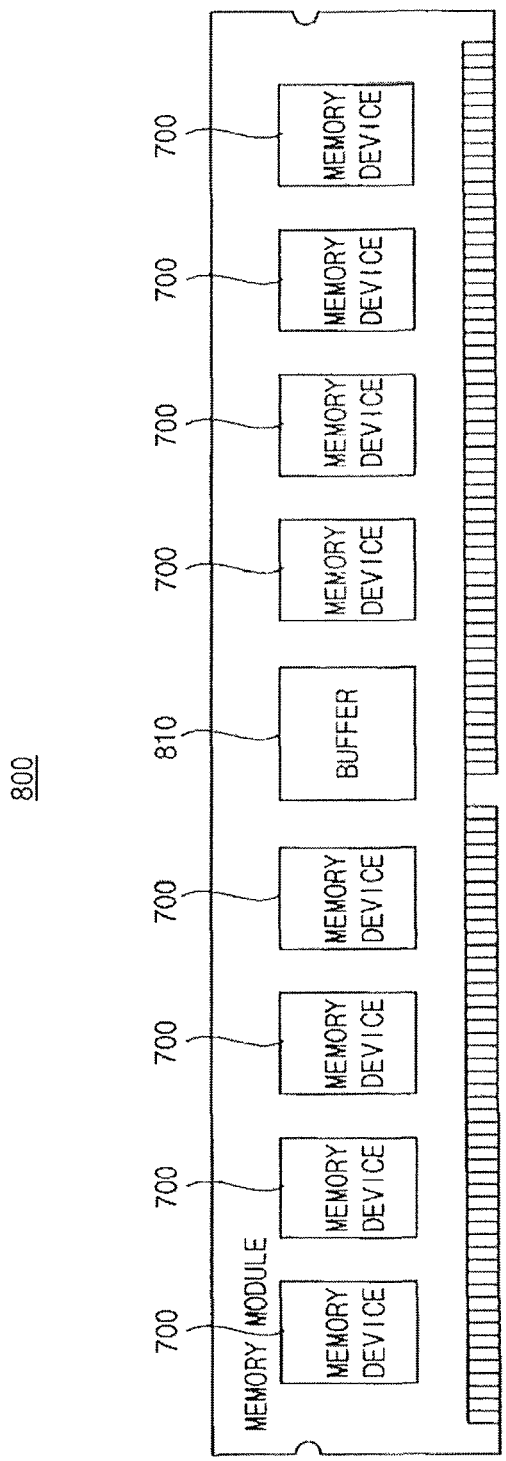
FIG. 25 is a block diagram illustrating a memory module according to an exemplary embodiment of the present inventive concept.

FIG. 25 is a block diagram illustrating a memory module according to an exemplary embodiment.

Referring to FIG. 25, a memory module 800 includes a plurality of semiconductor memory devices 700. The memory module 800 may include, but is not limited to, an unbuffered dual in-line memory module (UDIMM), a registered dual in-line memory module (RDIMM), a fully buffered dual in-line memory module (FBDIMM), or a load reduced dual in-line memory module LRDIMM. The memory module 800 includes a buffer 810 that provides a command/address signal and data by buffering the command/address signal and the data from a memory controller through a plurality of transmission lines. Data transmission lines between the buffer 810 and the semiconductor memory devices 700 may be coupled in a point-to-point topology, and command/address transmission lines between the buffer 810 and the semiconductor memory devices 700 may be coupled in a multi-drop topology, a daisy-chain topology, a fly-by daisy-chain topology, or the like. The memory controller interfaces with the memory module 800 by driving only a load of the buffer 810. Accordingly, the memory module 800 may include more memory devices and/or more memory ranks, and a memory system may include more memory modules.

Each semiconductor memory device 700 includes the memory core 10 of FIG. 5. Each semiconductor memory device 700 drives a selected word line and its neighboring word line adjacent to the selected word line with different voltage levels to screen potential weak cells in a test mode, and increases a precharge voltage of the neighboring word line when data is written in the memory cells coupled to the selected word line to perform a write operation.

Figure 26:
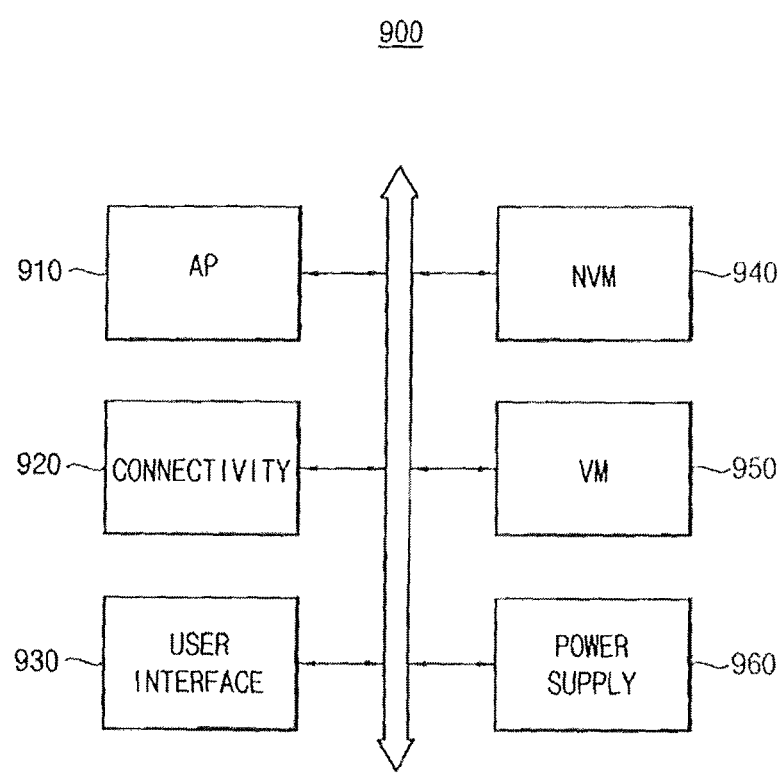
FIG. 26 is a block diagram illustrating a mobile system according to an exemplary embodiment.

FIG. 26 is a block diagram illustrating a mobile system according to an exemplary embodiment.

Referring to FIG. 26, a mobile system 900 includes an application processor 910, a connectivity unit 920, a volatile memory device 950, a nonvolatile memory device 940, a user interface 930 and a power supply 960. The mobile system 900 may be included in a mobile phone, a smart phone, a personal digital assistant (PDA), a portable multimedia player (PMP), a digital camera, a music player, a portable game console, a navigation system, etc.

The application processor 910 executes application programs, such as a web browser, a game application, a video player, etc. The application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 performs wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 950 stores data processed by the application processor 910, or operates as a working memory. For example, the volatile memory device 950 may include a dynamic random access memory, such as DDR SDRAM, LPDDR SDRAM, GDDR SDRAM, RDRAM, etc. The volatile memory device 950 includes the memory core 10 of FIG. 5. The volatile memory device 950 drives a selected word line and its neighboring word line adjacent to the selected word line with different voltage levels to screen potential weak cells in a test mode, and increases precharge voltage of the neighboring word line when the data are written in the memory cells coupled to the selected word line to perform write operation easily.

The nonvolatile memory device 940 stores the code and data that are necessary to start the mobile system 900. For example, the nonvolatile memory device 940 may include an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 includes at least one input device, such as a keypad, a touch screen, etc., and at least one output device, such as a speaker, a display device, etc. The power supply 960 supplies a power supply voltage to the mobile system 900. The mobile system 900 may further include a camera image processor (CIS), and/or a storage device, such as a memory card, a solid state drive (SSD), a hard disk drive (HDD), a CD-ROM, etc.

The mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 27:
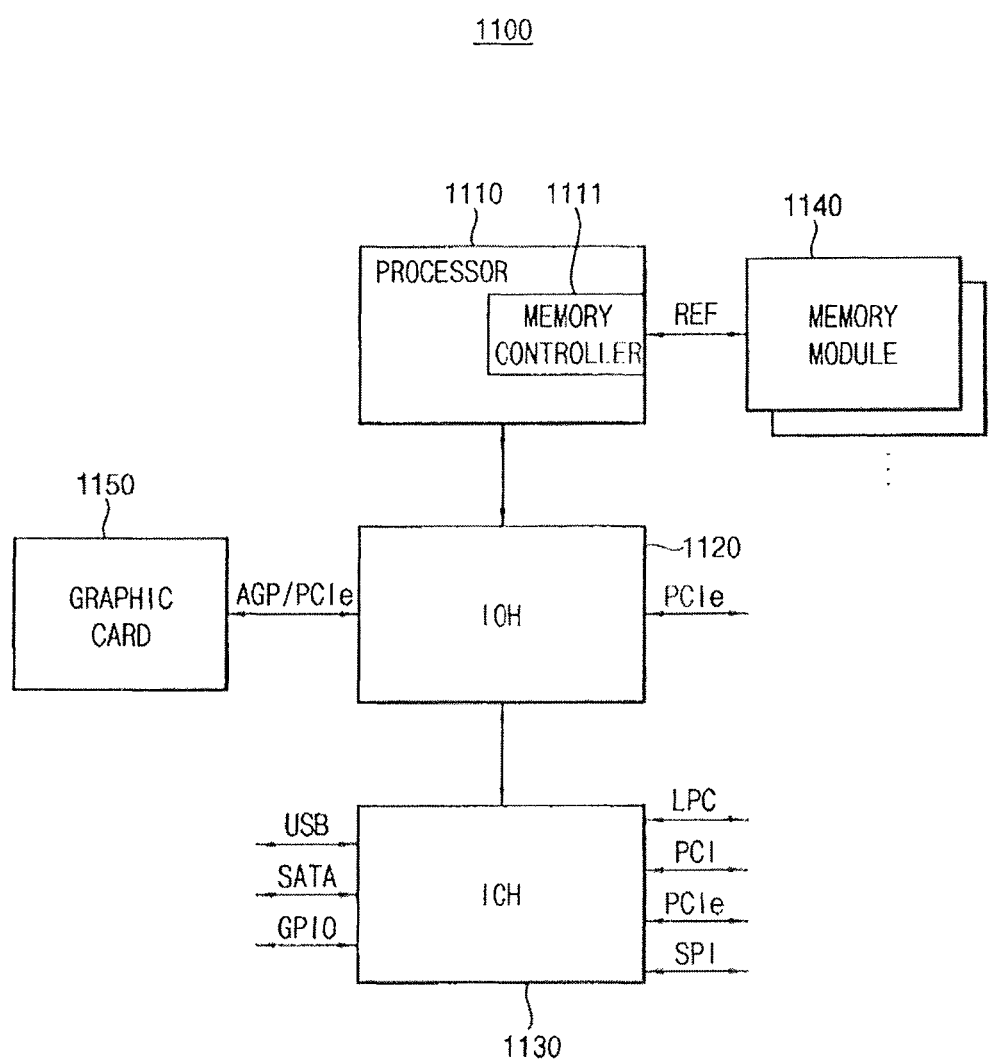
FIG. 27 is a block diagram illustrating a computing system according to an exemplary embodiment of the present inventive concept.

FIG. 27 is a block diagram illustrating a computing system according to an exemplary embodiment.

Referring to FIG. 27, a computing system 1100 includes a processor 1110, an input/output hub (IOH) 1120, an input/output controller hub (ICH) 1130, at least one memory module 1140 and a graphic card 1150. The computing system 1100 may be included in a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing software programs for performing specific calculations or tasks. For example, the processor 1110 may include a microprocessor, a central process unit (CPU), a digital signal processor, or the like. The processor 1110 may include a single core or multiple cores. For example, the processor 1110 may be a multi-core processor, such as a dual-core processor, a quad-core processor, a hexa-core processor, etc. Although FIG. 28 illustrates the computing system 1100 including a single processor 1110, the computing system 1100 may include a plurality of processors. The processor 1110 may include an internal or external cache memory.

The processor 1110 includes a memory controller 1111 for controlling operations of the memory module 1140. The memory controller 1111 included in the processor 1110 may be referred to as an integrated memory controller (IMC). The memory controller 1111 may perform the test methods as described above. A memory interface between the memory controller 1111 and the memory module 1140 may be implemented with a single channelor multiple channels. In some embodiments, the memory controller 1111 may be located inside the input/output hub 1120, which may be referred to as memory controller hub (MCH).

The memory module 1140 includes a plurality of semiconductor memory devices that stores data provided from the memory controller 1111. Each semiconductor memory device includes the memory core 10 of FIG. 5. Each semiconductor memory device drives a selected word line and its neighboring word line adjacent to the selected word line with different voltage levels to screen potential weak cells in a test mode, and increases precharge voltage of the neighboring word line when data is written in the memory cells coupled to the selected word line to perform a write operation.

The input/output hub 1120 manages data transfer between processor 1110 and devices, such as the graphic card 1150. The input/output hub 1120 is coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 27 illustrates the computing system 1100 including one input/output hub 1120, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphic card 1150 is coupled to the input/output hub 1120 via AGP or PCIe. The graphics card 1150 controls a display device (not shown) for displaying an image. The graphics card 1150 includes an internal processor for processing image data and an internal memory device. The input/output hub 1120 may include an internal graphics device along with or instead of the graphic card 1150 outside the graphic card 1150. The graphic device included in the input/output hub 1120 is referred to as integrated graphics. Further, the input/output hub 1120 including the internal memory controller and the internal graphics device is referred to as a graphics and memory controller hub (GMCH).

The input/output controller hub 1130 performs a data buffering operation and an interface arbitration operation to efficiently operate various system interfaces. The input/output controller hub 1130 is coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The processor 1110, the input/output hub 1120 and the input/output controller hub 1130 may be implemented as separate chipsets or separate integrated circuits. For example, at least two of the processor 1110, the input/output hub 1120 and the input/output controller hub 1130 may be implemented as a single chipset.

As mentioned above, a selected word line and its neighboring word line adjacent to the selected word line is driven with different voltage levels to screen potential weak cells in a test mode at a wafer level. When the weak cells are screened at a wafer level, a packaging process is eliminated thereby reducing production costs and increasing a production yield. A precharge voltage of the neighboring word line is increased when data is written in the memory cells coupled to the selected word line to perform a write operation.

The an exemplary embodiment as described above may be applicable to various semiconductor memory devices.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of testing a semiconductor memory device comprising a memory cell block including a plurality of memory cells, a first group of word lines coupled to first memory cells among the plurality, and a second group of word lines coupled to second memory cells among the plurality that alternate with the first group, the method comprising:
writing data to the first and second memory cells during a first period;
applying a first boosted voltage to the second group of word lines and a second boosted voltage to the first group of word lines during a second period after the first period, wherein the first boosted voltage has a voltage level different from that of the second boosted voltage; and
reading the data from the first memory cells coupled to the first group of the word lines during a third period after the second period to determine whether each of the first memory cells is defective.

2. The method of claim 1, wherein the first boosted voltage is higher than the second boosted voltage.

3. The method of claim 1, wherein writing the data to the first and second memory cells comprises:
writing a first data having a logic high level to the first memory cells coupled to the first group of the word lines; and
writing a second data having a logic low level to the second memory cells coupled to the second group of the word lines.

4. The method of claim 1, wherein the first group of the word lines include odd-numbered word lines, and the second group of the word lines include even-numbered word lines, wherein each of the first group of the word lines and each of the first group of the word lines are alternately arranged in the memory cell block.

5. The method of claim 1, wherein the testing of the semiconductor memory device is performed at a wafer level in a manufacturing process of the semiconductor memory device.

6. The method of claim 1, further comprising applying the first boosted voltage to all the word lines during the first period.

7. The method of claim 1, further comprising applying a negative voltage to all the word lines during a fourth period prior to the first period.

8. The method of claim 1, further comprising applying a negative voltage to all the word lines during a fourth period between the first and second periods.

9. The method of claim 1, further comprising applying a negative voltage to all the word lines during a fourth period between the second and third periods.

10. The method of claim 9, further comprising applying the first boosted voltage only to the first group of word lines during a fifth period between the fourth and third periods.

11. A method of testing a semiconductor memory device comprising a memory cell block including a plurality of memory cells, a first group of word lines coupled to first memory cells among the plurality, and a second group of word lines coupled to second memory cells among the plurality that alternate with the first group, the method comprising:
writing data to the first and second memory cells during a first period;
applying a first negative voltage to the first group of word lines and a second negative voltage to the second group of word lines during a second period after the first period, wherein the first negative voltage has a voltage level different from that of the second negative voltage; and
reading the data from the first memory cells coupled to the first group of the word lines during a third period after the second period to determine whether each of the first memory cells is defective.

12. The method of claim 11, further comprising applying a first boosted voltage to all the word lines during the first period.

13. The method of claim 11, wherein the first negative voltage is lower than the second negative voltage.

14. The method of claim 11, wherein writing the data to the first and second memory cells comprises:
writing a first data having a logic high level to the first memory cells coupled to the first group of the word lines; and
writing a second data having a logic low level to the second memory cells coupled to the second group of the word lines.

15. The method of claim 11, further comprising applying the first negative voltage to all the word lines during a fourth period prior to the first period.

16. The method of claim 11, further comprising applying the first negative voltage to all the word lines during a fourth period between the first and second periods.

17. The method of claim 11, further comprising applying the first negative voltage to all the word lines during a fourth period between the second and third periods.

18. The method of claim 17, further comprising applying the first boosted voltage only to the first group of word lines during a fifth period between the fourth and third periods.

* * * * *